(12) United States Patent
Fujii

(10) Patent No.: US 8,829,519 B2
(45) Date of Patent: Sep. 9, 2014

(54) SEMICONDUCTOR DEVICE

(75) Inventor: Hidenori Fujii, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 418 days.

(21) Appl. No.: 12/051,024

(22) Filed: Mar. 19, 2008

(65) Prior Publication Data

US 2009/0078936 A1     Mar. 26, 2009

(30) Foreign Application Priority Data

Sep. 20, 2007  (JP) ................. 2007-243823

(51) Int. Cl.
| | | |
|---|---|---|
| H01L 29/04 | (2006.01) | |
| H01L 29/861 | (2006.01) | |
| H01L 29/66 | (2006.01) | |
| H01L 29/868 | (2006.01) | |

(52) U.S. Cl.
CPC ............ *H01L 29/868* (2013.01); *H01L 29/861* (2013.01); *H01L 29/66113* (2013.01)
USPC .................................... 257/51; 257/E29.003

(58) Field of Classification Search
CPC ............ H01L 29/66113; H01L 29/868; H01L 29/861
USPC .................. 257/161, 617, 656, 657, E29.336, 257/E29.337
See application file for complete search history.

(56) References Cited

U.S. PATENT DOCUMENTS

| | | | |
|---|---|---|---|
| 2003/0057522 A1* | 3/2003 | Francis et al. ................. | 257/566 |
| 2005/0035405 A1 | 2/2005 | Mauder et al. | |
| 2005/0077577 A1* | 4/2005 | Manna et al. ................. | 257/355 |
| 2008/0283881 A1* | 11/2008 | Lee .............................. | 257/292 |

FOREIGN PATENT DOCUMENTS

| | | |
|---|---|---|
| DE | 103 30 571 A1 | 2/2005 |
| EP | 0 614 231 A2 * | 9/1994 |
| EP | 1 014 453 A1 | 6/2000 |
| JP | 61-39575 A | 2/1986 |
| JP | 5-291607 | 11/1993 |
| JP | 7-273354 | 10/1995 |
| JP | 11-26779 | 1/1999 |
| JP | 2000-323724 | 11/2000 |
| JP | 2003-298072 | 10/2003 |
| JP | 2007-103905 A | 4/2007 |
| KR | 2003-0019486 | 3/2003 |

OTHER PUBLICATIONS

Notice of Allowance issued Sep. 6, 2010, in Korea Patent Application No. 10-2008-0042196 (with English-language Translation).
Office Action issued Oct. 16, 2012 in Japanese Patent Application No. 2007-243823 with English language translation.

* cited by examiner

*Primary Examiner* — Vongsavanh Sengdara
(74) *Attorney, Agent, or Firm* — Oblon, Spivak, McClelland, Maier & Neustadt, L.L.P.

(57) ABSTRACT

A PIN diode includes an anode electrode, a P layer, an I layer, an N layer and a cathode electrode. A polysilicon film is formed in a region near the pn junction or $n^+n$ junction where the density of carriers implanted in a forward bias state is relatively high, as a predetermined film having a crystal defect serving as a recombination center. The lifetime can thus be controlled precisely.

19 Claims, 48 Drawing Sheets

SEMICONDUCTOR DEVICE

BACKGROUND OF THE INVENTION

1. Field of the Invention

The present invention relates to a semiconductor device, and particularly to a semiconductor device having a PIN (Positive Intrinsic Negative) diode.

2. Description of the Background Art

In these years, inverters are used in those fields such as the field of industrial power units. For the inverter, usually a commercial power source (AC power source) is used. Thus, the inverter includes a converter unit first converting an AC voltage into a DC voltage (forward conversion), a smoothing circuit unit and an inverter unit converting the DC voltage into an AC voltage (inverse conversion). As a main power device of the inverter unit, an insulated gate bipolar transistor (hereinafter referred to as "IGBT") capable of performing switching operation at a relatively high speed is chiefly employed.

In most cases, the load of the inverter is an electric induction machine (motor which is an inductive load). The inductive load is connected to a point of an intermediate potential between an upper arm element and a lower arm element, and electric current flows to the inductive load in both of the positive and negative directions. Therefore, in order to direct the current flowing in the inductive load from the end where the load is connected back to the power supply of a high potential and to direct the current from the end where the load is connected to the ground, a freewheel diode for circulating the current between the inductive load and the closed circuit of the arm elements is necessary. One of such freewheel diodes is a PIN diode.

In the inverter, usually the IGBT is operated as a switch to repeat the OFF state and the ON state so as to control the power energy. Regarding the switching of the inverter with an inductive load, the ON state is reached through a turn-on process while the OFF state is reached through a turn-off process. Here, the turn-on process refers to a change of the IGBT from the OFF state to the ON state while the turn-off process refers to a change of the IGBT from the ON state to the OFF state.

While the IGBT is in the ON state, current does not flow through the PIN diode and the PIN diode is in the OFF state. In contrast, while the IGBT is in the OFF state, current flows through the PIN diode and the PIN diode is in the ON state. In order to improve the switching characteristic of the inverter, it is necessary to change the PIN diode from the ON state to the OFF state as fast as possible. Therefore, the PIN diode is required to have a shorter lifetime. Meanwhile, a shorter lifetime results in a problem that the resistance in the ON state (ON resistance) is higher. Therefore, in order to lower the ON resistance while ensuring the switching characteristic of the PIN diode, it is necessary to precisely control the lifetime of the PIN diode. The PIN diode is disclosed for example in Japanese Patent Laying-Open Nos. 11-026779 and 2000-323724.

The above-described semiconductor device, however, has the following problem. Conventionally, the lifetime of the PIN diode is controlled using electron beam radiation or platinum diffusion to form a crystal defect or impurity trap. These methods change the lifetime of the whole substrate. In other words, the lifetime of the PIN diode is conventionally controlled by changing the lifetime of the whole substrate, thereby controlling the lifetime of the PIN diode. It is therefore a problem that optimization of the lifetime of the PIN diode adapted to characteristics of an applied apparatus is difficult.

SUMMARY OF THE INVENTION

The present invention has been made to solve the above-described problem, and an object of the invention is to provide a semiconductor device that can precisely control the lifetime.

A semiconductor device according to the present invention includes an anode portion, a cathode portion, an intermediate portion and a predetermined film having a crystal defect. The anode portion includes a first region of a first conductivity type. The cathode portion includes a second region of a second conductivity type. The intermediate portion is located between the anode portion and the cathode portion and joined to the anode portion and to the cathode portion. The predetermined film having a crystal defect is formed in at least one of a portion on a side of the anode portion and a portion on a side of the cathode portion where carriers of a higher density than the density of carriers present around a center in a thickness direction of the intermediate portion in a forward bias state are present.

In the semiconductor device of the present invention, the predetermined film having a crystal defect serving as a recombination center is formed in the portion where carriers of a higher density are present in the forward bias state. In the process of forming the predetermined film, its thickness may be changed or a region where the film is formed may be selected for example to change the ratio of carriers recombining to disappear to the whole implanted carriers in a reverse bias state. Thus, according to characteristics of an apparatus to which the semiconductor device is applied, the lifetime of the semiconductor device can be controlled easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
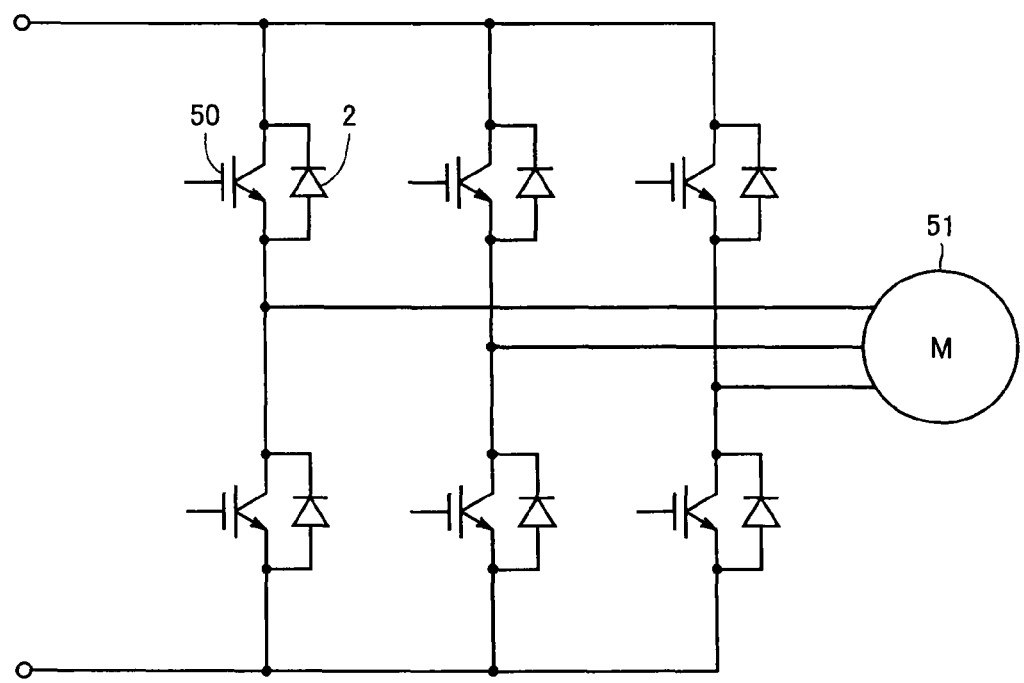
FIG. 1 is a circuit diagram showing an example of a circuit of an inverter apparatus to which a PIN diode according to each embodiment of the present invention is applied.
Figure 2:
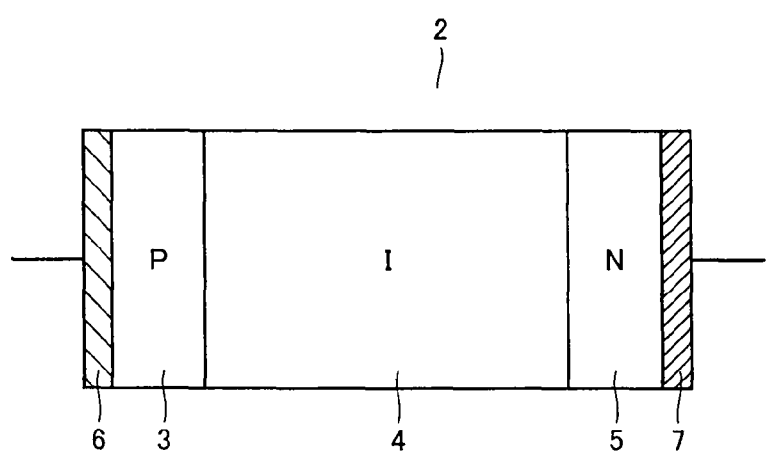
FIG. 2 is a cross section showing a configuration of the PIN diode according to each embodiment of the present invention.

First, features of a semiconductor device in each embodiment will be described. FIG. 1 shows an inverter circuit of an inverter apparatus controlling an inductive load. As shown in FIG. 1, the inverter apparatus includes an IGBT 50 controlling supply of electric power to an inductive load 51 and a PIN diode 2 serving as a path for freewheeling current from inductive load 51. PIN diode 2 is connected in parallel with IGBT 50. As shown in FIG. 2, PIN diode 2 includes an anode electrode 6 and a P layer 3 (anode portion), an I layer 4 (intermediate portion), and an N layer 5 and a cathode electrode 7 (cathode portion).

Figure 3:
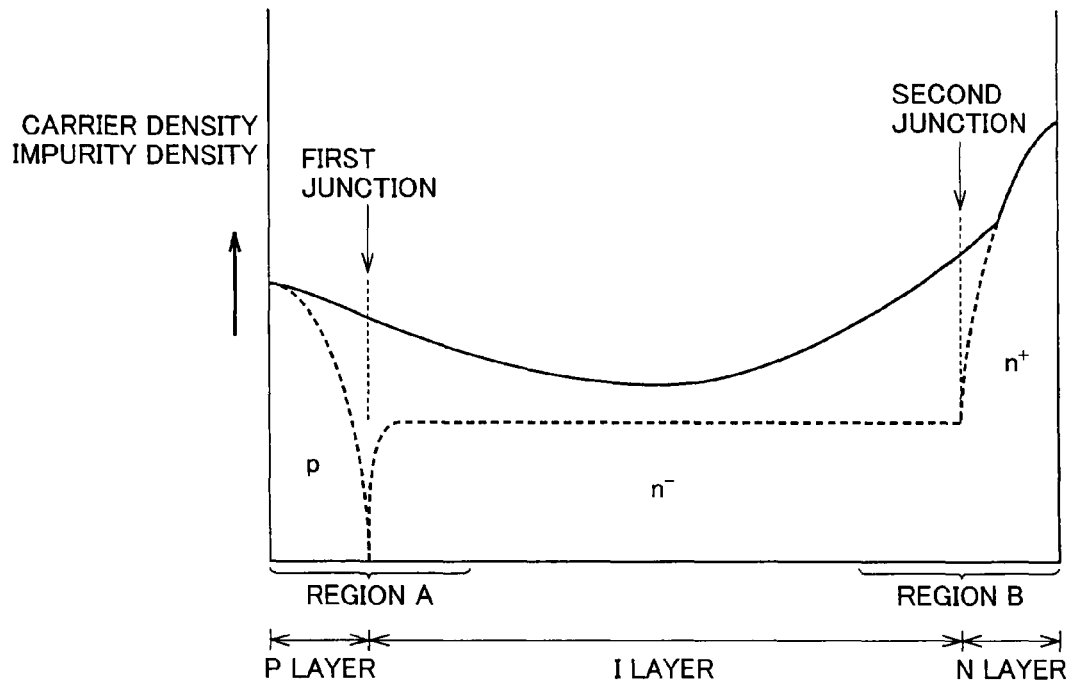
FIG. 3 is a graph showing a carrier density distribution in a forward bias state of the PIN diode according to each embodiment of the present invention.

As IGBT 50 is turned on to allow current to flow to inductive load 51 and thereafter IGBT 50 is turned off, energy accumulated in inductive load 51 causes freewheeling current to flow through PIN diode 2 so that PIN diode 2 is in a forward bias state (ON state). In this forward bias state, carriers are injected into I layer 4 of PIN diode 2 and a saturated state is reached. FIG. 3 shows a graph of a carrier density distribution in PIN diode 2 in the forward bias state.

As shown in FIG. 3, the graph (distribution) of the carrier density in the forward bias state is a curve of a substantially hyperbolic function connecting an end of the P layer and an end of the N layer. In the end of the P layer, the carrier density is identical to the impurity density of the P layer. In the end of the N layer, the carrier density is identical to the impurity density of the N layer.

Then, as IGBT 50 having been off is turned on, PIN diode 2 changes from the forward bias state to the state where a reverse bias voltage is applied. As the reverse bias voltage is applied to PIN diode 2, the carriers injected into the I layer disappear in the end.

In this PIN diode 2, in at least one of a portion on P layer 3 side and a portion on N layer 5 side in which there are carriers of a higher density than the density of carriers present around the center in the thickness direction (PN direction) of I layer 4, a film having a crystal defect serving as a recombination center of carriers is formed. More specifically, in a region A near the pn junction or a region B near the $n^+n$ junction in which the density of carriers injected in the forward bias state is relatively high, a polysilicon film or amorphous silicon film having a crystal defect is formed. Thus, carriers (electron and hole) in the region of a relatively high carrier density recombine at the crystal defect to disappear in a short time. Of the remaining carriers, electrons are discharged from N layer 5 side while holes are discharged from P layer 3 side, and the implanted carriers disappear in the end.

In other words, in this PIN diode, the region (film thickness, area thereof for example) where a predetermined film serving as a carrier recombination center is formed may be changed or the grain size may be changed for example so as to change the ratio, to the whole implanted carriers, of carriers recombining to disappear in region A and region B where the carrier density is relatively high. Accordingly, the lifetime of PIN diode 2 is controlled. In the following, a specific description will be given of the PIN diode having a predetermined film formed with a crystal defect serving as a recombination center.

First Embodiment

A description will be given of a first example of a PIN diode having its anode side where a polysilicon film having a grain boundary is formed as a predetermined film with a crystal defect serving as a recombination center.

Figure 4:
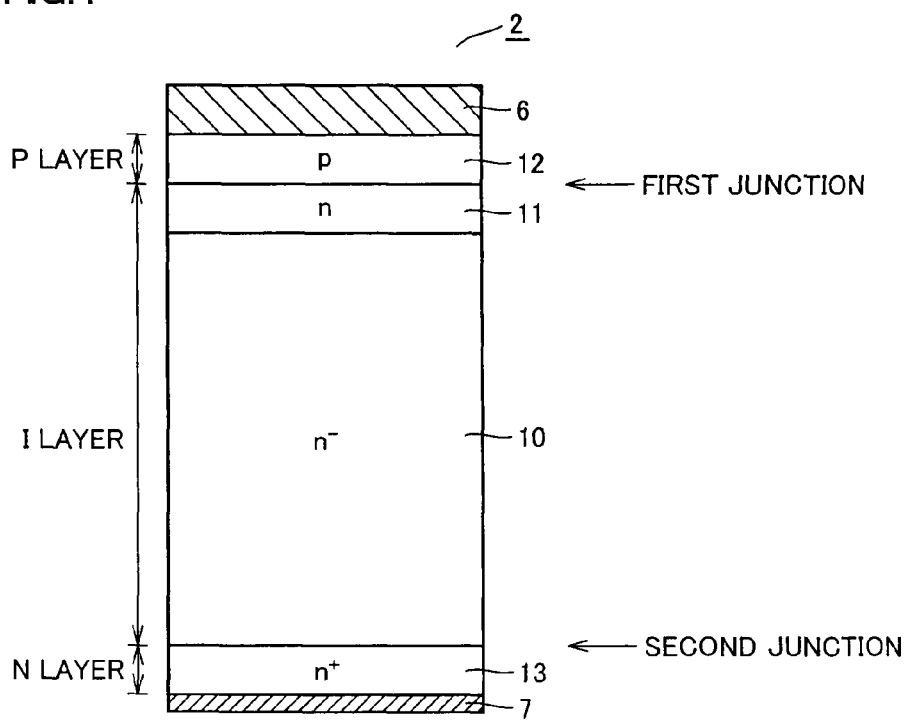
FIG. 4 is a cross section showing a configuration of a PIN diode according to a first embodiment of the present invention.

As shown in FIG. 4, on one main surface of an $n^-$-type silicon substrate ($\rho n=1\times10^{13}$-$1\times10^{15}/cm^3$, $tn=10$-$700$ μm) 10, an n-type polysilicon film ($N=1\times10^{14}$-$1\times10^{16}/cm^3$) 11 (third region) is formed. On n-type polysilicon film 11, a p-type polysilicon film ($N=1\times10^{14}$-$1\times10^{17}/cm^3$, $Xj=0.5$-$5$ μm) 12 (first region) is formed. In contact with a surface of p-type polysilicon film 12, an anode electrode 6 electrically connected to p-type polysilicon film 12 is formed. On the other main surface of $n^-$-type silicon substrate 10, an $n^+$-type region ($N=1\times10^{16}$-$1\times10^{19}/cm^3$, $Xj=0.5$-$5$ μm) 13 (second region) is formed to a predetermined depth from the surface. Further, in contact with a surface of $n^+$-type region 13, a cathode electrode 7 electrically connected to $n^+$-type region 13 is formed.

In PIN diode 2, the P layer is formed of p-type polysilicon film 12, the I layer is formed of n-type polysilicon film 11 and $n^-$-type silicon substrate 10 and the N layer is formed of $n^+$-type region 13. The junction between p-type polysilicon film 12 and n-type polysilicon film 11 is a first junction (pn junction) and the junction between $n^-$-type silicon substrate 10 and $n^+$-type region 13 is a second junction ($n^+n$ junction).

Figure 5:
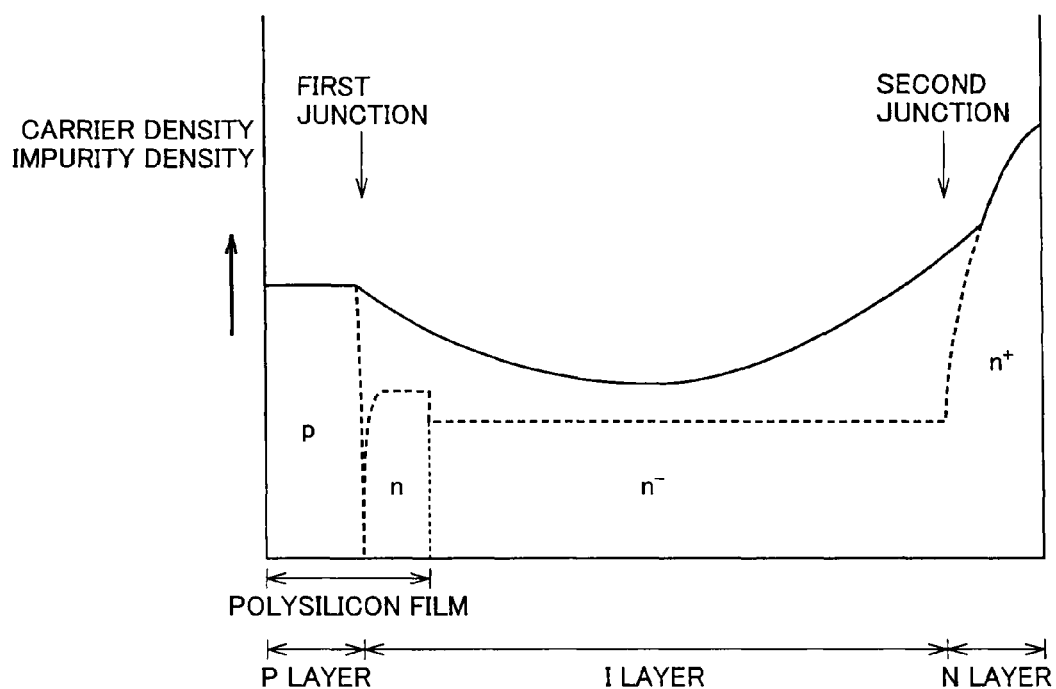
FIG. 5 is a graph showing a carrier density distribution in a forward bias state of the PIN diode in the embodiment.
Figure 6:
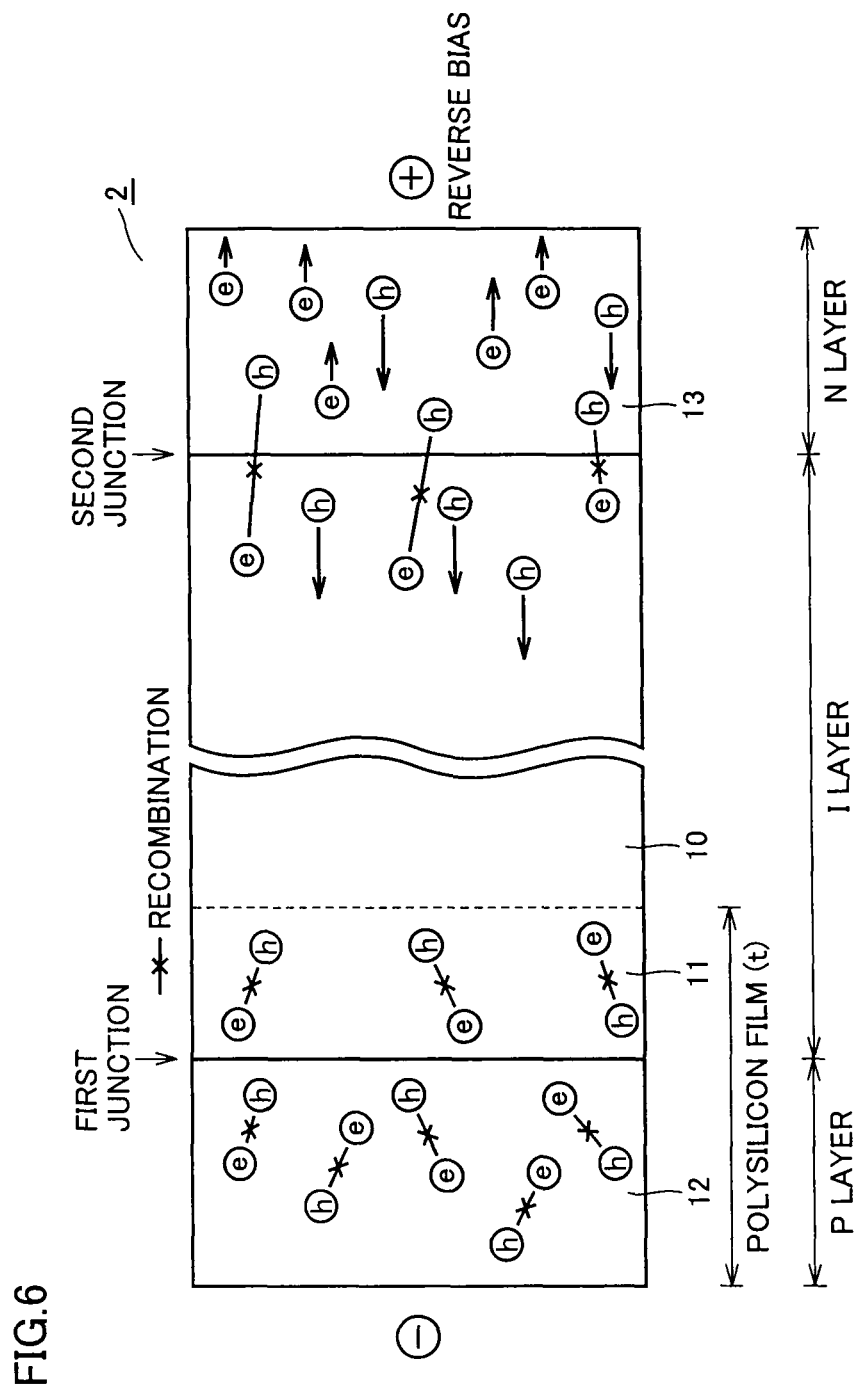
FIG. 6 illustrates behavior of carriers in a reverse bias state of the PIN diode in the embodiment.

Thus, in this PIN diode 2, n-type polysilicon film 11 and p-type polysilicon film 12 having a grain boundary serving as a recombination center are formed on the anode side to include the pn junction. FIG. 5 shows a graph (distribution) of the carrier density in the forward bias state of PIN diode 2. As shown in FIG. 5, the graph (solid line) of the carrier density in the forward bias state is a curve of a substantially hyperbolic function connecting an end of the anode side and an end of the cathode side. The carrier density on the anode side is identical to the impurity density of p-type polysilicon film 12, and the carrier density on the cathode side is identical to the impurity density of $n^+$-type region 13. The broken line represents the impurity density of each region which is a component of the PIN diode. In FIG. 5, a density of carriers throughout the intermediate portion is greater than a greatest impurity density throughout the intermediate portion.

Behavior of carriers in a reverse bias state of PIN diode 2 will be described. As the IGBT having been off is turned on and a reverse bias voltage is applied to PIN diode 2, carriers that are a part of implanted carriers and that are present in the polysilicon film (n-type polysilicon film 11 and p-type polysilicon film 12) disappear at a recombination center at the grain boundary in a short time. Regarding the remaining carriers including carriers present on the cathode side, electrons are discharged from the cathode electrode and holes are discharged from the anode electrode. A part of electrons and holes recombine to disappear and the implanted carriers finally disappear so that PIN diode 2 is turned off.

Figure 7:
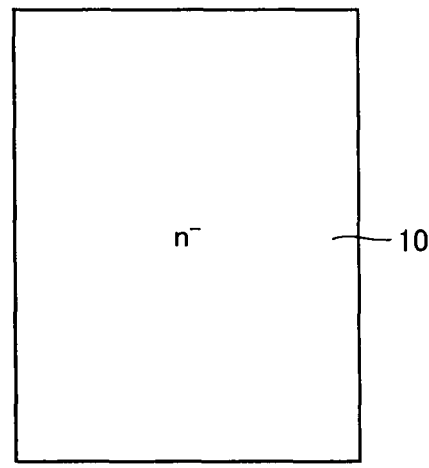
FIG. 7 is a cross section showing a step of a method of manufacturing the PIN diode in the embodiment.
Figure 8:
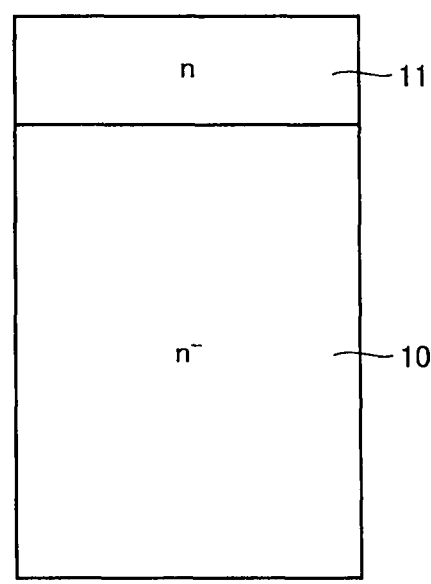
FIGS. 8 to 13 are respectively cross sections showing respective steps performed after respective steps shown in FIGS. 7 to 12 in the embodiment.
Figure 9:
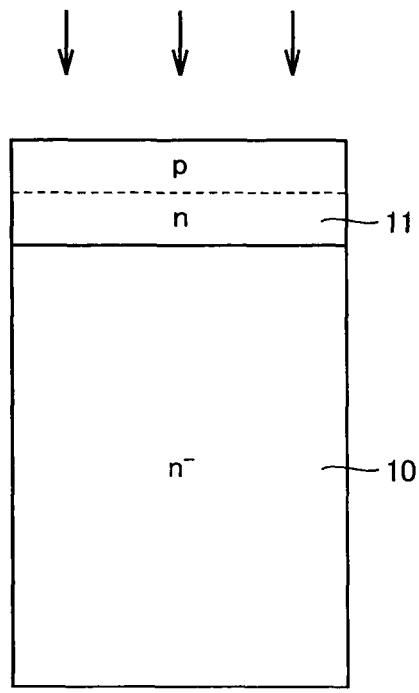
Figure 10:
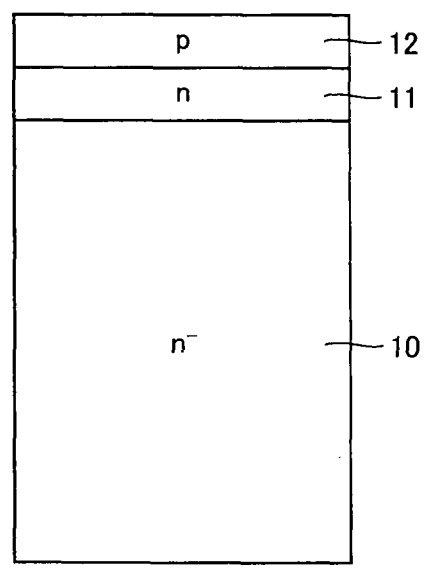

An example of a method of manufacturing the above-described PIN diode will be described. As shown in FIG. 7, $n^-$-type silicon substrate 10 having main surfaces is prepared. Then, as shown in FIG. 8, on one surface of $n^-$-type silicon substrate 10, n-doped polysilicon film 11 is formed. Then, as shown in FIG. 9, p-type impurities are implanted by the ion implantation to polysilicon film 11. Then, as shown in FIG. 10, predetermined heat treatment is performed to thermally diffuse the p-type impurities and thereby form p-type polysilicon film 12. In this way, the pn junction is formed by n-type polysilicon film 11 and p-type polysilicon film 12.

Figure 11:
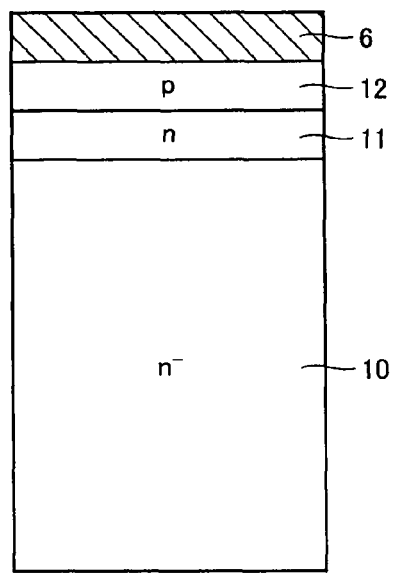
Figure 12:
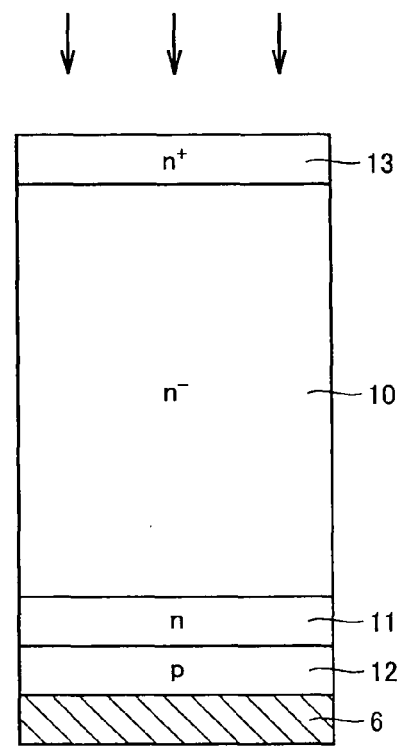
Figure 13:
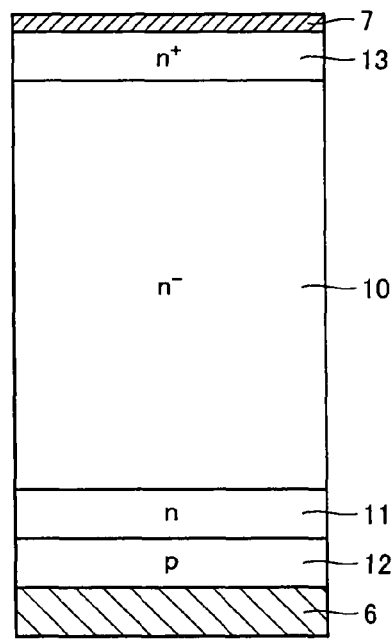

Then, as shown in FIG. 11, on a surface of p-type polysilicon film 12, barrier metal and aluminum are formed to form anode electrode 6. Then, as shown in FIG. 12, to the other main surface of $n^-$-type silicon substrate 10, n-type impurities are implanted by the ion implantation. Then, as shown in FIG. 13, predetermined heat treatment is performed to thermally diffuse the n-type impurities and thereby form $n^+$-type region 13. On a surface of $n^+$-type region 13, aluminum for example is formed to form cathode electrode 7. In this way, PIN diode 2 shown in FIG. 4 is completed.

Regarding above-described PIN diode 2, in the anode-side region where the carrier density is relatively high, n-type polysilicon film 11 and p-type polysilicon film 12 having a grain boundary are formed. Thus, the carriers present in the region where the carrier density is relatively high are caused to disappear at the grain boundary in a short time. Thus, the lifetime of PIN diode 2 can be shortened and the state of PIN diode 2 can be more speedily changed from the ON state to the OFF state.

Further, by changing thickness t or the grain size for example of n-type polysilicon film 11 and p-type polysilicon film 12, the ratio of carriers recombining to disappear to the whole implanted carriers can be changed. For example, as the thickness of the polysilicon film is increased, the number of recombination centers is increased to further shorten the lifetime. As the grain size of the polysilicon film is increased, the region of the grain boundary is narrower to decrease the number of recombination centers and further extend the lifetime. In this way, the lifetime of PIN diode 2 is adjusted. While surge for example caused upon sudden switching of PIN diode 2 is suppressed, the resistance in the ON state (ON resistance) of PIN diode 2 can be prevented from increasing.

In other words, for PIN diode 2, the thickness for example of the polysilicon film (n-type polysilicon film 11 and p-type polysilicon film 12) serving as a recombination center of carriers may be changed according to characteristics of an inverter apparatus for example to which PIN diode 2 is applied, so as to control the lifetime of PIN diode 2 and decrease the ON resistance while ensuring the switching characteristic.

Second Embodiment

A description will be given of a second example of the PIN diode having its anode side where a polysilicon film with a grain boundary is formed as a predetermined film having a crystal defect which serves as a recombination center.

Figure 14:
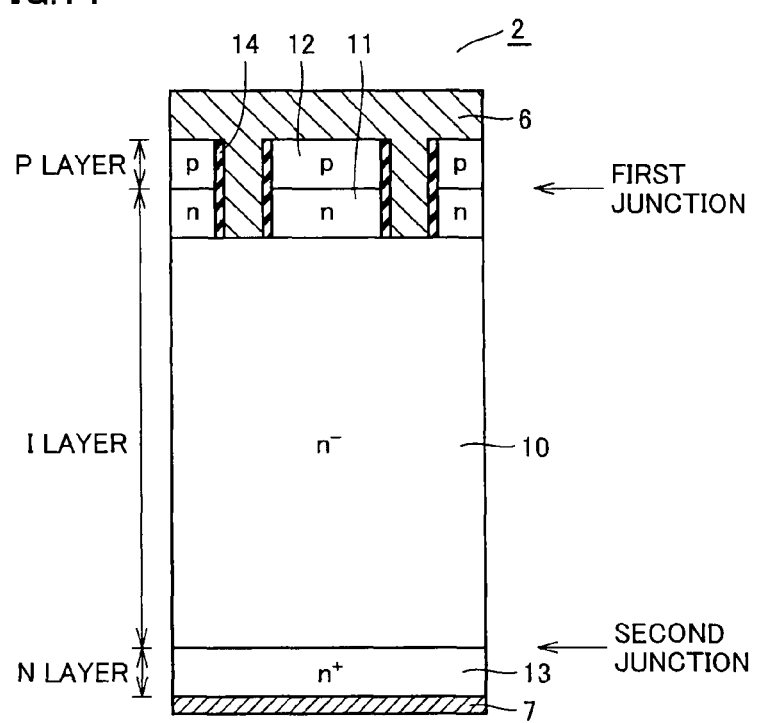
FIG. 14 is a cross section showing a configuration of a PIN diode according to a second embodiment of the present invention.

As shown in FIG. 14, on one main surface of n⁻-type silicon substrate 10, n-type polysilicon film 11 and p-type polysilicon film 12 are selectively formed. On the sidewalls of n-type polysilicon film 11 and p-type polysilicon film 12, an insulating film 14 is formed. Anode electrode 6 is formed to be in contact with a surface of n⁻-type silicon substrate 10 exposed to a region where n-type polysilicon film 11 and p-type polysilicon film 12 are not formed, and in contact with a surface of p-type polysilicon film 12. Components and features other than those described above are similar to those of the PIN diode shown in FIG. 4. Therefore, like components are denoted by like reference characters and the description thereof will not be repeated.

In this PIN diode 2, n-type polysilicon film 11 and p-type polysilicon film 12 having a grain boundary which serves as a recombination center are selectively formed on the anode side to include the pn junction. The graph (distribution) of the carrier density in the forward bias state of PIN diode 2 including the region where n-type polysilicon film 11 and p-type polysilicon film 12 are formed is substantially identical to the graph of the carrier density as shown in FIG. 5.

Figure 15:
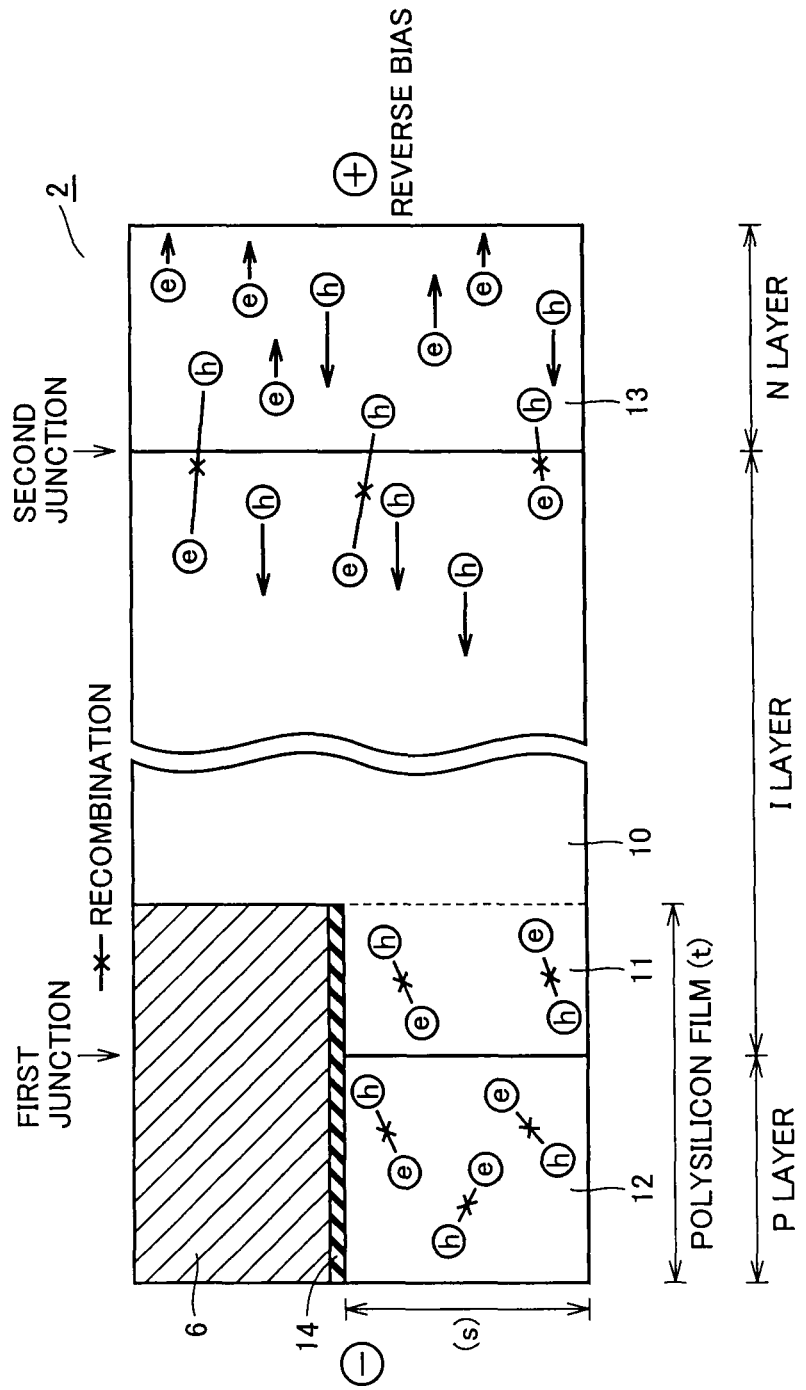
FIG. 15 illustrates behavior of carriers in a reverse bias state of the PIN diode in the embodiment.

A description will be given of behavior of carriers in the reverse bias state of PIN diode 2. As shown in FIG. 15, as a reverse bias voltage is applied to PIN diode 2, carriers that are a part of implanted carriers and that are present in the polysilicon film (n-type polysilicon film 11 and p-type polysilicon film 12) disappear at a recombination center at the grain boundary in a short time. Regarding the remaining carriers including the carriers present on the cathode side, electrons are discharged from the cathode electrode and holes are discharged from the anode electrode. A part of electrons and holes recombine to disappear. The implanted carriers finally disappear and PIN diode 2 is turned off.

Figure 16:
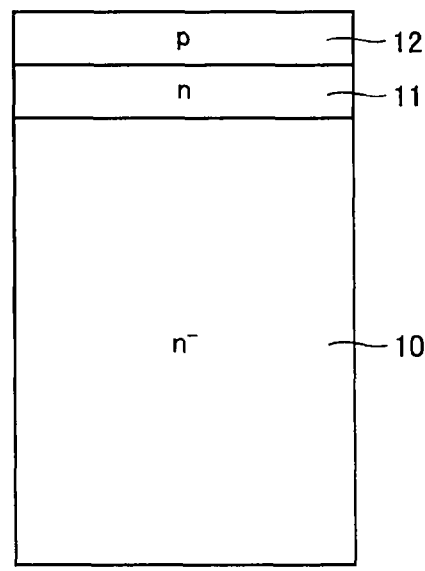
FIG. 16 is a cross section showing a step of a method of manufacturing the PIN diode in the embodiment.
Figure 17:
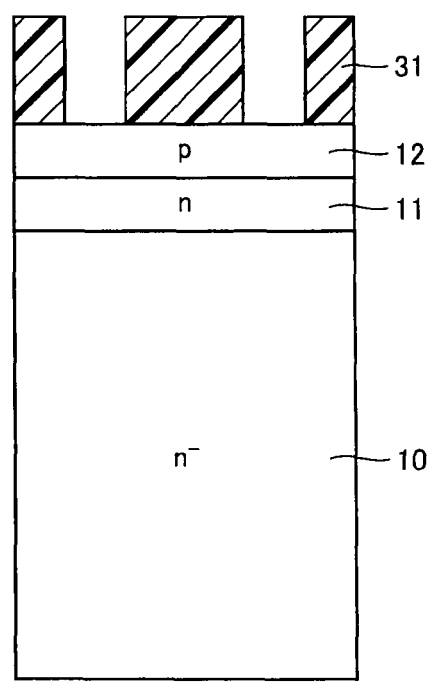
FIGS. 17 to 20 are respectively cross sections showing respective steps performed after respective steps shown in FIGS. 16 to 19 in the embodiment.
Figure 18:
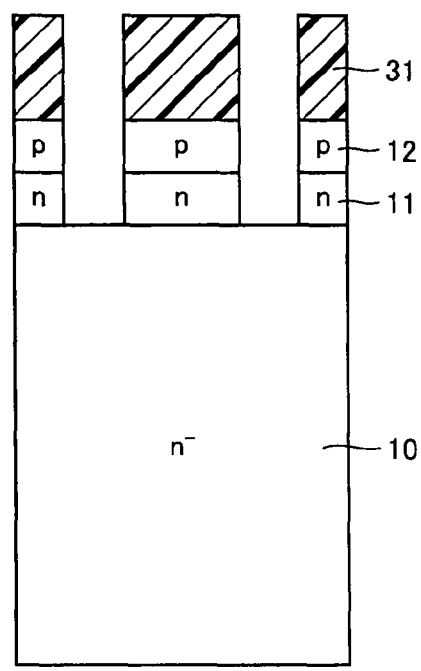

An example of the method of manufacturing the above-described PIN diode will be described. Through steps similar to the above-described steps shown in FIGS. 7 to 10, on one surface of n⁻-type silicon substrate 10, n-type polysilicon film 11 and p-type polysilicon film 12 are formed as shown in FIG. 16. Then, as shown in FIG. 17, on a surface of p-type polysilicon film 12, a resist patter 31 is formed. Then, as shown in FIG. 18, resist pattern 31 is used as a mask to anisotropically etch p-type polysilicon film 12 and n-type polysilicon film 11. Accordingly, p-type polysilicon film 12 and n-type polysilicon film 11 are left only in a predetermined region while a part of p-type polysilicon film 12 and n-type polysilicon film 11 that are present in the remaining region are removed to expose a surface of n⁻-type silicon substrate 10. Resist pattern 31 is thereafter removed.

Figure 19:
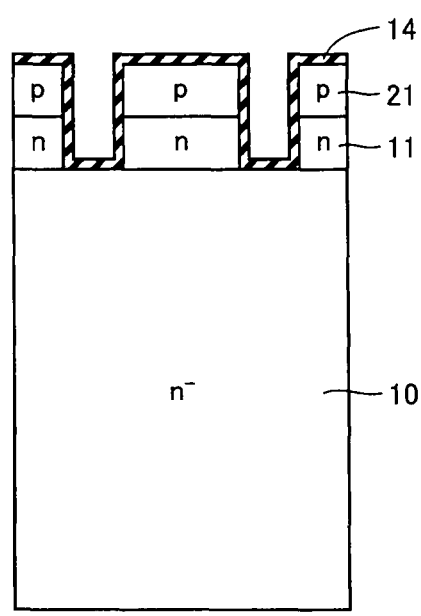
Figure 20:
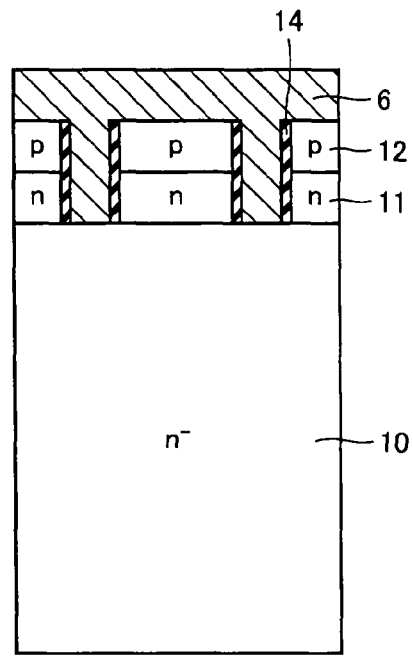

As shown in FIG. 19, predetermined heat treatment is applied to form insulating film 14 on respective exposed surfaces of n⁻-type silicon substrate 10, n-type polysilicon film 11 and p-type polysilicon film 12. Anisotropic etching is performed on insulating film 14 to leave the part of insulating film 14 that is present on the side surfaces of n-type polysilicon film 11 and p-type polysilicon film 12 and remove the remaining part of insulating film 14. As shown in FIG. 20, anode electrode 6 is formed. After this, through the steps similar to those shown in FIGS. 12 and 13 as described above, PIN diode 2 shown in FIG. 14 is completed.

Regarding PIN diode 2 as described above, in a region on the anode side where the carrier density is relatively high, n-type polysilicon film 11 and p-type polysilicon film 12 having a grain boundary are formed. Thus, carriers present in this region are caused to disappear at the grain boundary in a short time. The lifetime of PIN diode 2 can thus be shortened, and the PIN diode 2 can be more speedily changed from the ON state to the OFF state.

Moreover, thickness t of n-type polysilicon film 11 and p-type polysilicon film 12 may be changed and additionally these polysilicon films may be selectively formed so as to change area S where the polysilicon films are formed (see FIG. 15). The ratio of carriers that recombine to disappear to the whole implanted carriers can more precisely be changed.

In other words, according to characteristics of an inverter apparatus for example to which PIN diode 2 is applied, the area or thickness of a region where the polysilicon film (p-type polysilicon film 12 and n-type polysilicon film 11) serving as a carrier recombination center is formed can be changed to more precisely control the lifetime of PIN diode 2 and decrease the ON resistance while ensuring the switching characteristic.

Figure 21:
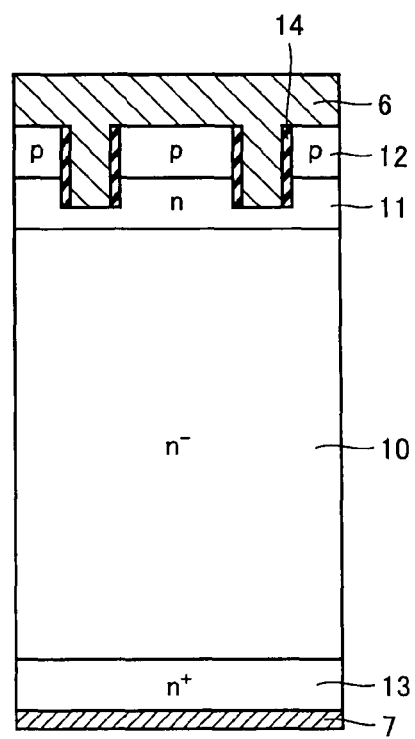
FIG. 21 is a cross section showing a configuration of a PIN diode according to a modification of the embodiment.

In the above description of the method of manufacturing the PIN diode, an example is described of the case where anisotropic etching is performed on p-type polysilicon film 12 and n-type polysilicon film 11 in the manner that exposes the surface of n⁻-type silicon substrate 10 (just etching). The manner of etching is not limited to this and etching may be performed to leave a part of n-type polysilicon film 11 as shown in FIG. 21 and selectively form a relatively thick portion and a relatively thin portion. In this case as well, similar effects can be obtained.

Third Embodiment

A description will be given of a third example of the PIN diode having its anode side where a polysilicon film with a grain boundary is formed as a predetermined film having a crystal defect which serves as a recombination center.

Figure 22:
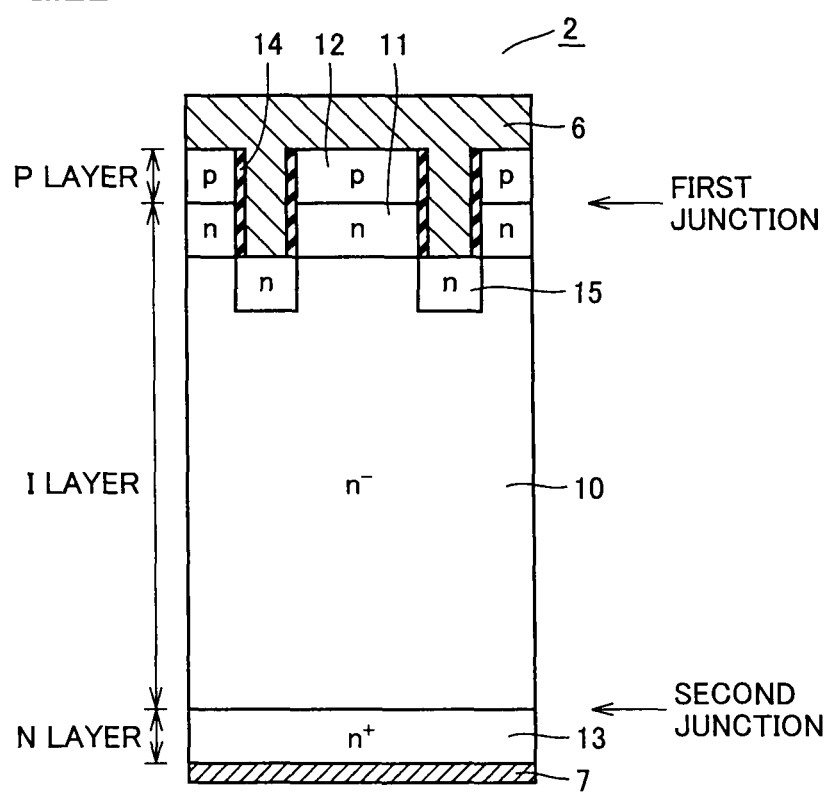
FIG. 22 is a cross section showing a configuration of a PIN diode according to a third embodiment of the present invention.
Figure 23:
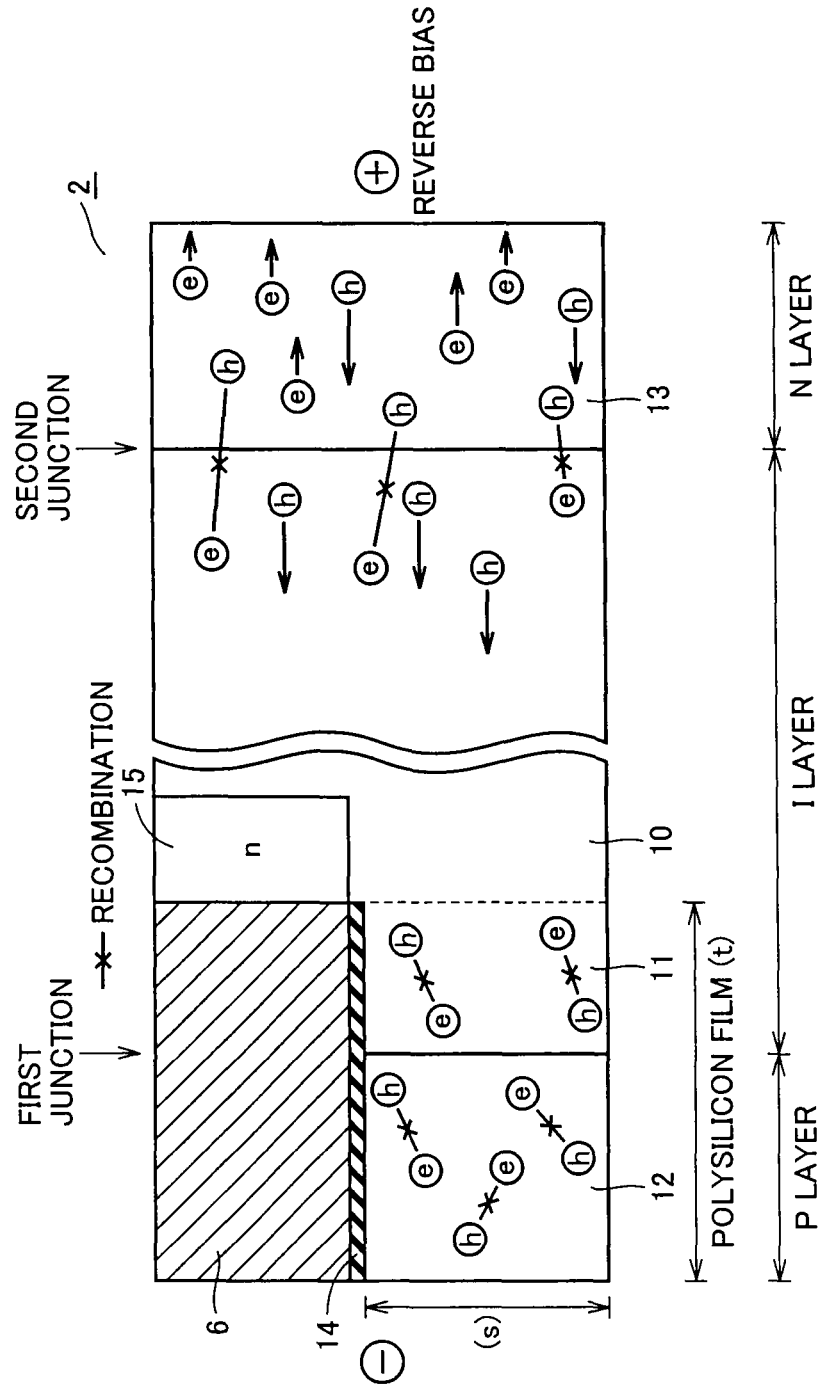
FIG. 23 illustrates behavior of carriers in a reverse bias state of the PIN diode in the embodiment.

As shown in FIG. 22, on one main surface of n⁻-type silicon substrate 10, n-type polysilicon film 11 and p-type polysilicon film 12 are selectively formed. In a portion of n⁻-type silicon substrate 10 located in the region where n-type polysilicon film 11 and p-type polysilicon film 12 are not formed, an n-type region ($N=1 \times 10^{14}$-$1 \times 10^{17}/cm^3$, $Xj=0.5$-$5$ μm) 15 (fourth region) is formed. Components and features other than the above-described ones are similar to those of the PIN diode shown in FIG. 14. Therefore, like components are denoted by like reference characters and the description thereof will not be repeated.

This PIN diode is configured similarly to the PIN diode shown in FIG. 14 except that n-type region 15 is formed. Further, the graph (distribution) of the carrier density in the forward bias state of PIN diode 2 including the region where n-type polysilicon film 11 and p-type polysilicon film 12 are formed is substantially identical to the graph of the carrier density shown in FIG. 5.

Further, behavior of carriers in the reverse bias state of PIN diode 2 is also substantially identical to the carrier behavior of the PIN diode shown in FIG. 14. As shown in FIG. 15, a reverse bias voltage is applied to PIN diode 2 to cause carriers that are a part of implanted carriers and that are present in the polysilicon film (n-type polysilicon film 11 and p-type polysilicon film 12) disappear at a recombination center at the grain boundary in a short time. Regarding the remaining carriers including carriers present on the cathode side, electrons are discharged from the cathode electrode and holes are discharged from the anode electrode. A part of electrons and holes recombine to disappear. The implanted carriers finally disappear to cause PIN diode 2 to become OFF.

Figure 24:
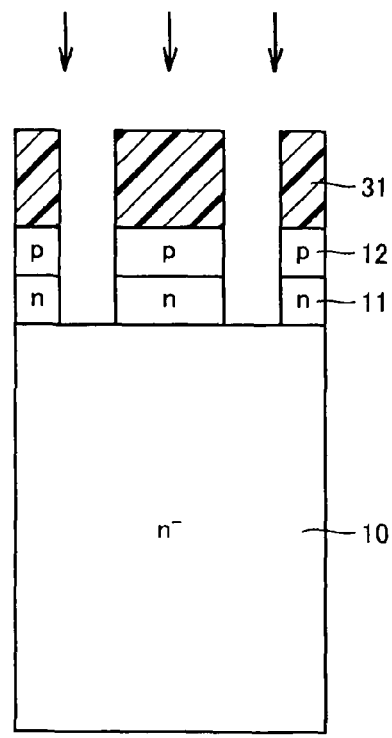
FIG. 24 is a cross section showing a step of a method of manufacturing the PIN diode in the embodiment.

An example of the method of manufacturing the above-described PIN diode will be described. Through the steps similar to those shown in FIGS. 7 to 10 and FIGS. 16 to 18, resist pattern 31 is used as a mask to implant n-type impurities by the ion implantation to the exposed surface of $n^-$-type silicon substrate 10 as shown in FIG. 24. Resist pattern 31 is thereafter removed.

Figure 25:
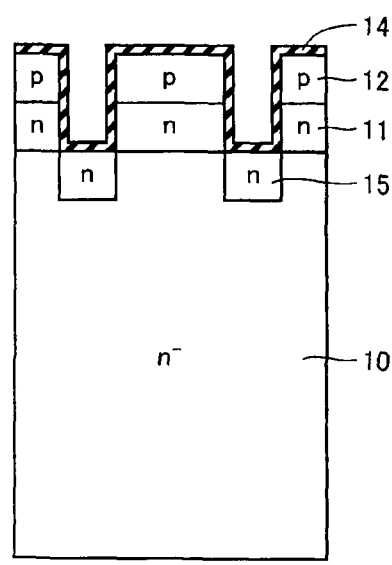
FIG. 25 is a cross section showing a step performed after the step shown in FIG. 24 in the embodiment.

Then, as shown in FIG. 25, predetermined heat treatment is performed to form insulating film 14 on respective exposed surfaces of $n^-$-type silicon substrate 10, n-type polysilicon film 11 and p-type polysilicon film 12. The implanted n-type impurities are thermally diffused to form n-type region 15. After this, through steps similar to those shown in FIGS. 20, 12 and 13 described above, PIN diode 2 shown in FIG. 22 is completed.

Regarding PIN diode 2 described above, particularly n-type region 15 is formed so that the ratio of holes and electrons recombining to disappear in the reverse bias state increases. Further, the absolute amount of electrons to be caused to disappear can be decreased. Thus, the thickness of the polysilicon film and the area where the polysilicon film is formed may be changed and additionally n-type region 15 may be changed to more precisely change the ratio of carriers recombining to disappear to the whole implanted carriers.

In other words, regarding this PIN diode 2, according to characteristics of an inverter apparatus for example to which PIN diode 2 is applied, the area and thickness of the region where the polysilicon film (n-type polysilicon film 11 and p-type polysilicon film 12) is formed can be changed and further n-type region 15 can be formed to more precisely control the lifetime of PIN diode 2 and reduce the ON resistance while ensuring the switching characteristic.

Fourth Embodiment

A description will be given of a fourth example of the PIN diode having its anode side where a polysilicon film with a grain boundary is formed as a predetermined film with a crystal defect which serves as a recombination center.

Figure 26:
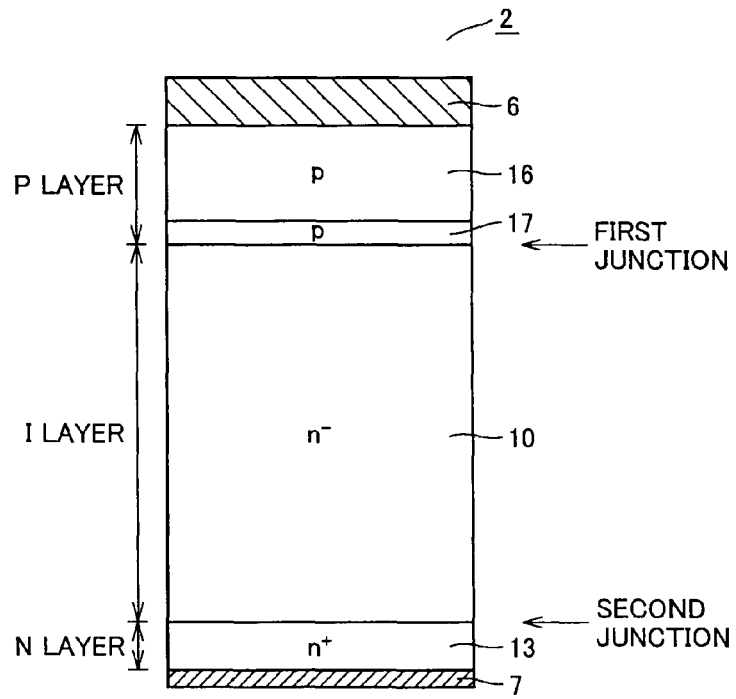
FIG. 26 is a cross section showing a configuration of a PIN diode according to a fourth embodiment of the present invention.

As shown in FIG. 26, on one main surface of $n^-$-type silicon substrate 10, a p-type region 17 (fifth region) is formed to a predetermined depth from the surface. On the surface of p-type region 17, a p-type polysilicon film 16 is formed. In contact with the surface of p-type polysilicon film 16, anode electrode 6 electrically connected to p-type polysilicon film 16 is formed. On the other main surface of $n^-$-type silicon substrate 10, $n^+$-type region 13 is formed. In contact with a surface of $n^+$-type region 13, cathode electrode 7 electrically connected to $n^+$-type region 13 is formed.

In the PIN diode 2, the P layer is formed of p-type polysilicon film 16 and p-type region 17, the I layer is formed of $n^-$-type silicon substrate 10 and the N layer is formed of $n^+$-type region 13. Further, the junction between p-type region 17 and $n^-$-type silicon substrate 10 is the first junction (pn junction) and the junction between $n^-$-type silicon substrate 10 and $n^+$-type region 13 is the second junction ($n^+n$ junction).

Figure 27:
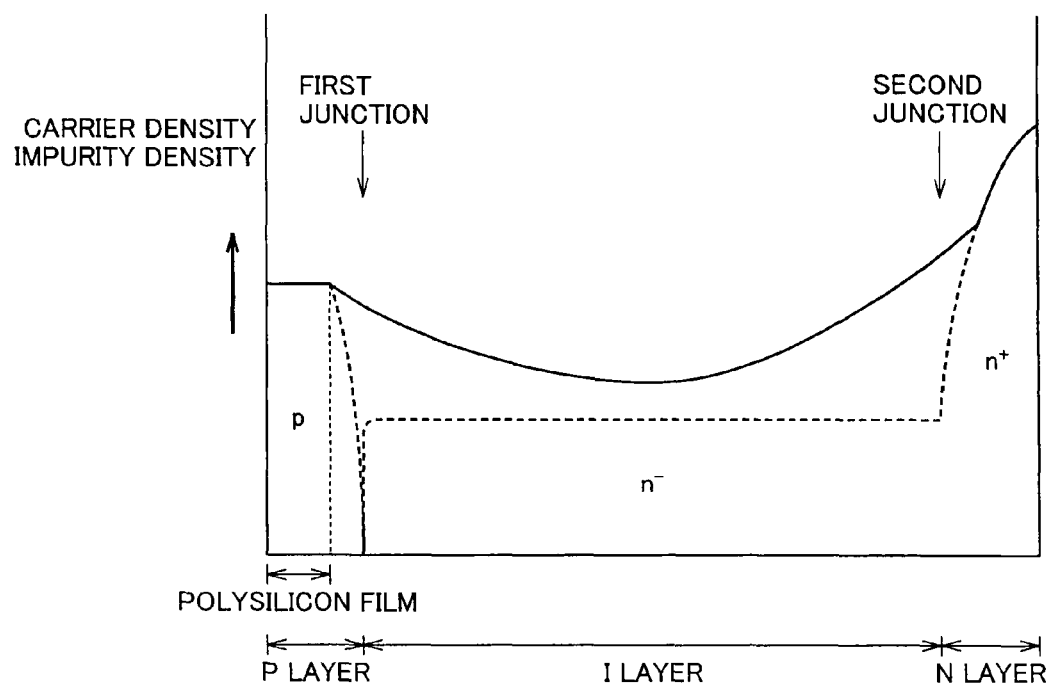
FIG. 27 is a graph showing a carrier density distribution in a forward bias state of the PIN diode in the embodiment.

Regarding PIN diode 2, p-type polysilicon film 16 having a grain boundary serving as a recombination center is formed on the anode side and located near the pn junction. FIG. 27 shows a graph (distribution) of the carrier density in the forward bias state of PIN diode 2. As shown in FIG. 27, the graph (solid line) of the carrier density in the forward bias state is a curve of a substantially hyperbolic function connecting an end on the anode side and an end on the cathode side. The carrier density on the anode side is identical to the impurity density of p-type polysilicon film 16 and the carrier density on the cathode side is identical to the impurity density of $n^+$-type region 13. The broken line represents the impurity concentration of each region which is a component of the PIN diode.

Figure 28:
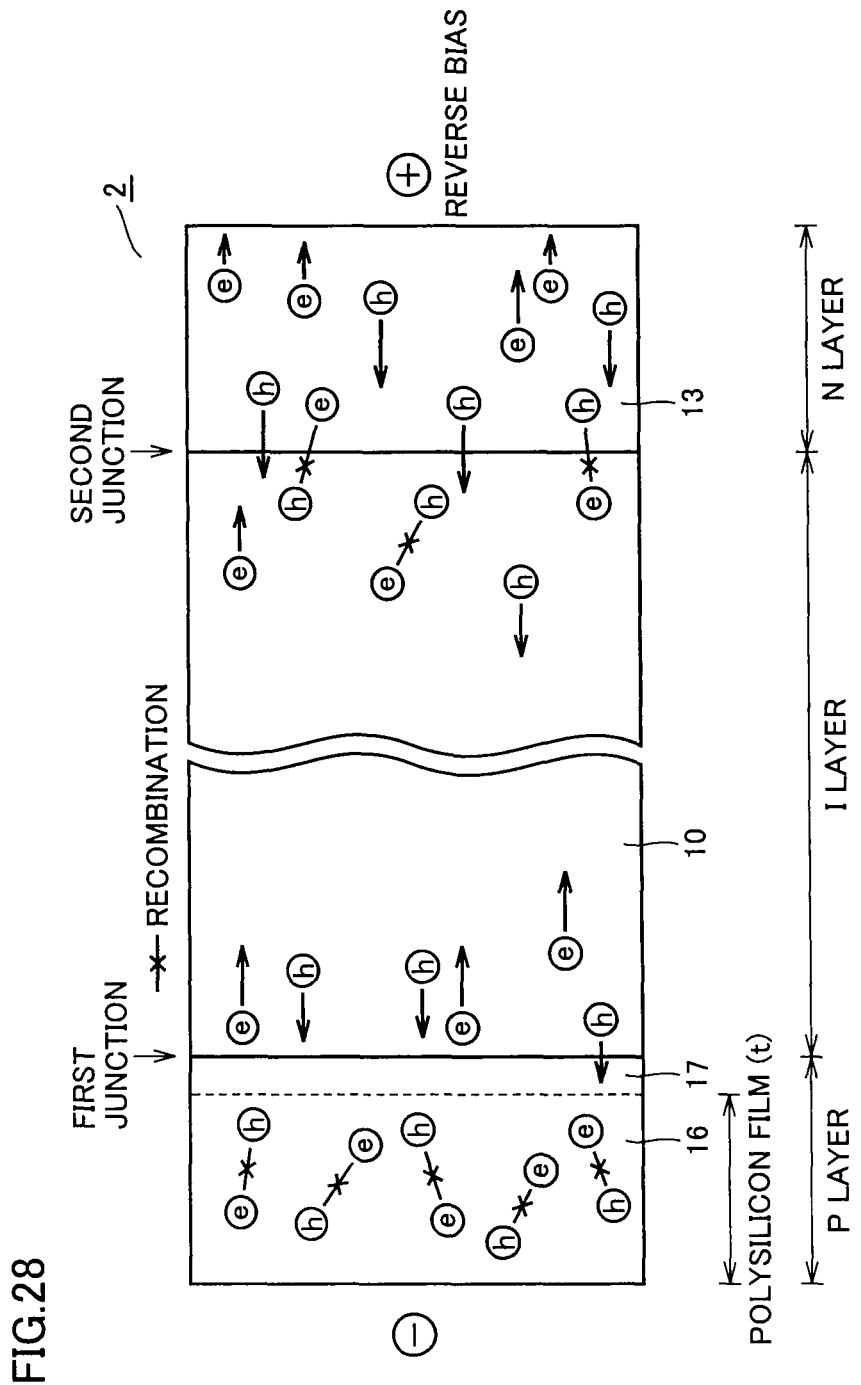
FIG. 28 illustrates behavior of carriers in a reverse bias state of the PIN diode in the embodiment.

A description will be given of behavior of carriers in the reverse bias state of PIN diode 2. As shown in FIG. 28, as a reverse bias voltage is applied to PIN diode 2, carriers that are a part of implanted carriers and that are present in p-type polysilicon film 16 disappear at a grain boundary serving as a recombination center in a short time. Regarding remaining carriers including carriers present on the cathode side, electrons are discharged from the cathode electrode and holes are discharged from the anode electrode. A part of electrons and holes recombine to disappear. The implanted carriers finally disappear and PIN diode 2 is turn OFF.

Figure 29:
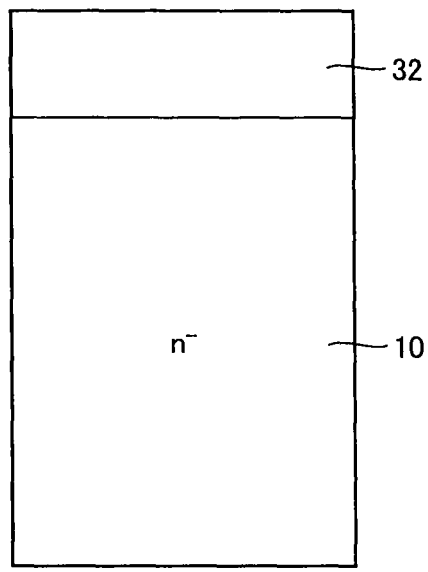
FIG. 29 is a cross section showing a step of a method of manufacturing the PIN diode in the embodiment.
Figure 30:
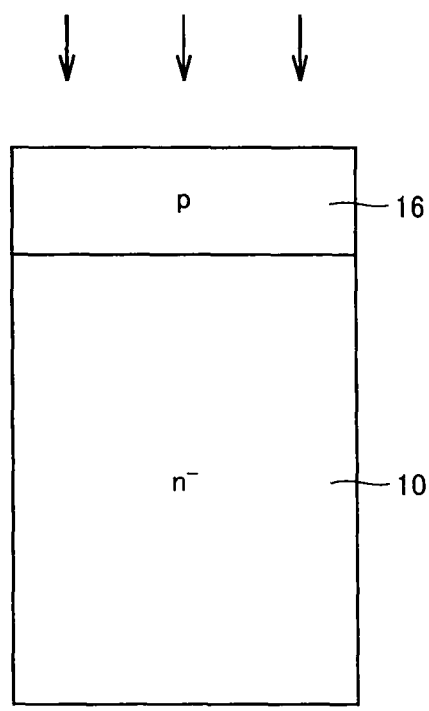
FIGS. 30 and 31 are respectively cross sections showing respective steps performed after respective steps shown in FIGS. 29 and 30 in the embodiment.
Figure 31:
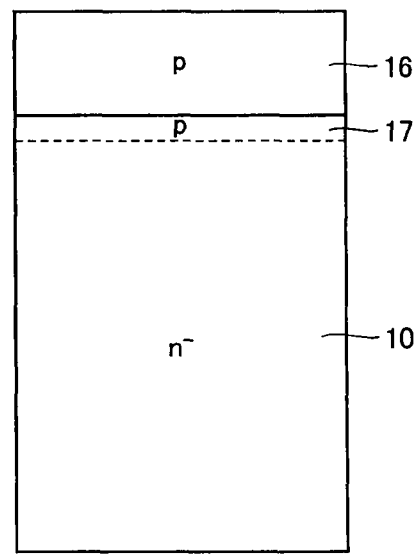

An example of the method of manufacturing the above-described PIN diode will be described. As shown in FIG. 29, on one surface of $n^-$-type silicon substrate 10, a polysilicon film 32 of a predetermined thickness is formed. As shown in FIG. 30, p-type impurities are implanted to polysilicon film 32 by the ion implantation to form p-type polysilicon film 16. Then, as shown in FIG. 31, predetermined heat treatment is performed to cause the p-type impurities in p-type polysilicon film 16 to thermally diffuse to $n^-$-type silicon substrate 10 and thereby form p-type region 17. After this, through steps similar to those shown in FIGS. 11 to 13 described above, PIN diode 2 as shown in FIG. 26 is completed.

Regarding PIN diode 2 described above, p-type polysilicon film 16 having a grain boundary is formed in the anode-side region where the carrier density is relatively high. Thus, carriers present in the region can be caused to disappear at the grain boundary in a short time. The lifetime of PIN diode 2 can be shortened. The state of PIN diode 2 can more speedily be changed from the ON state to the OFF state. Moreover, thickness t of p-type polysilicon film 16 can be changed to precisely change the ratio, to the whole implanted carriers, of the carriers recombining to disappear. Further, since the pn junction (first junction) is not located in the polysilicon film (p-type polysilicon film 16), carriers are prevented from recombining to disappear so that the leakage current can be reduced.

In other words, regarding PIN diode 2, according to characteristics of an inverter apparatus for example to which PIN diode 2 is applied, the thickness for example of p-type polysilicon film 16 that is a recombination center of carriers can be changed to precisely control the lifetime of PIN diode 2 and reduce the ON resistance while ensuring the switching characteristic.

Fifth Embodiment

A description will be given of a fifth example of the PIN diode having its anode side where a polysilicon film with a grain boundary is formed as a predetermined film having a crystal defect which serves as a recombination center.

Figure 32:
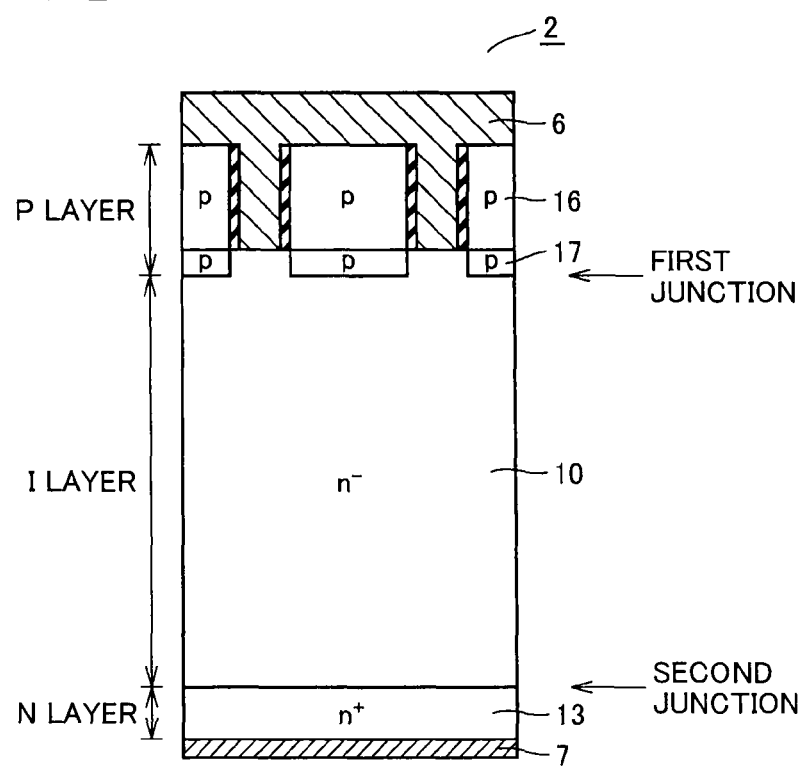
FIG. 32 is a cross section showing a configuration of a PIN diode according to a fifth embodiment of the present invention.

As shown in FIG. 32, on one main surface of $n^-$-type silicon substrate 10, p-type polysilicon film 16 is selectively formed. In a portion of $n^-$-type silicon substrate 10 that is located directly below p-type polysilicon film 16, a p-type region 17 is selectively formed to a predetermined depth from the surface of $n^-$-type silicon substrate 10, so that p-type region 17 is formed to correspond to p-type polysilicon film 16. On the sidewall of p-type polysilicon film 16, insulating film 14 is formed. Anode electrode 6 is formed to be in contact with a surface of n⁻-type silicon substrate 10 that is exposed to the region where p-type polysilicon film 16 is not formed and to be in contact with a surface of p-type polysilicon film 16. Components and features other than the above-described ones are similar to those of the PIN diode shown in FIG. 26. Thus, like components are denoted by like reference characters and the description thereof will not be repeated.

In PIN diode 2, p-type polysilicon film 16 with a grain boundary which serves as a recombination center is selectively formed on the anode side and in the vicinity of the pn junction. The graph (distribution) of the carrier density in the forward bias state of PIN diode 2 including the region where p-type polysilicon film 16 is formed is substantially identical to the graph of the carrier density shown in FIG. 27.

Figure 33:
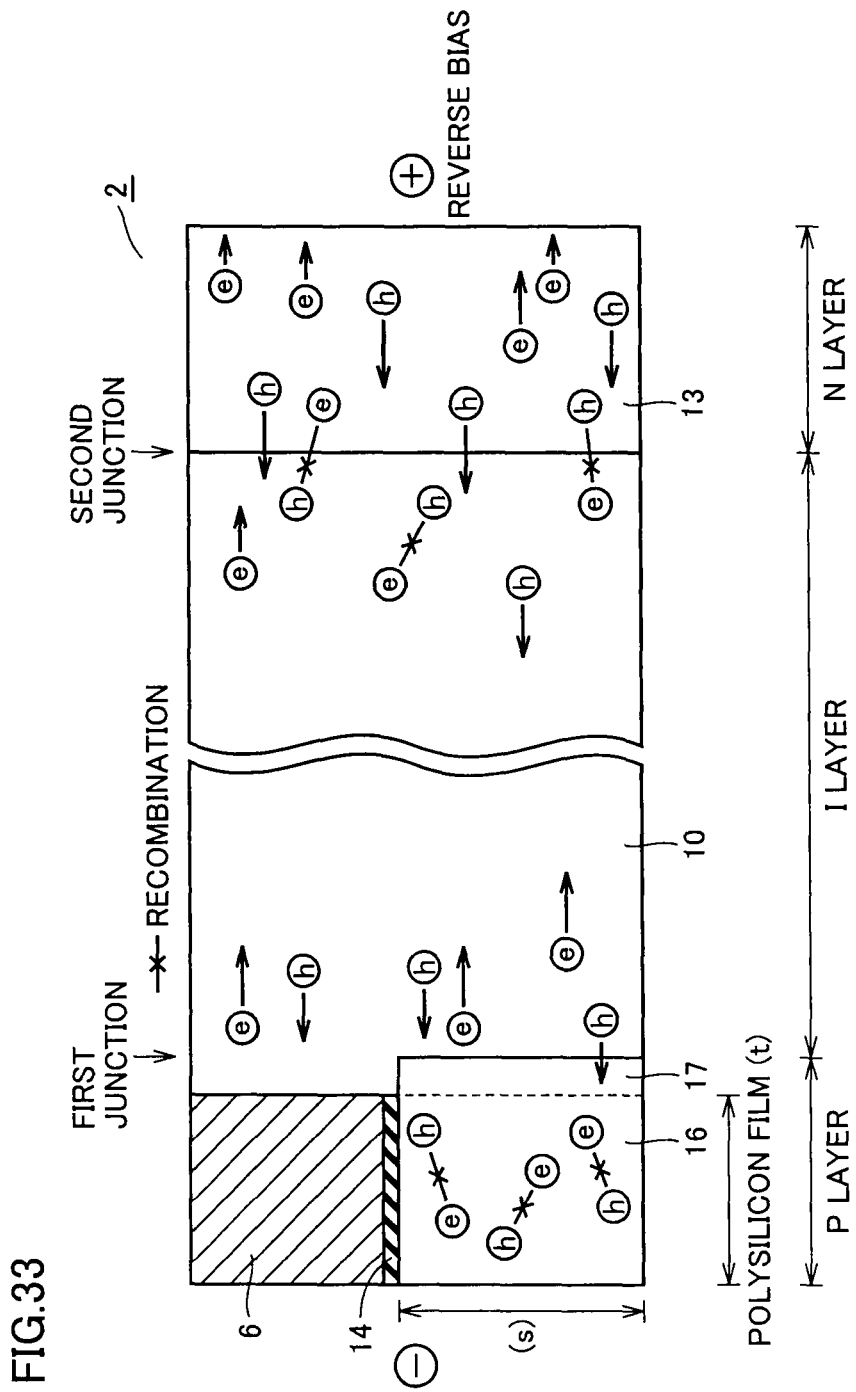
FIG. 33 illustrates behavior of carriers in a reverse bias state of the PIN diode in the embodiment.

Behavior of carriers in the reverse bias state of PIN diode 2 will be described. As shown in FIG. 33, as a reverse bias voltage is applied to PIN diode 2, carriers that are a part of implanted carriers and that are present in p-type polysilicon film 16 disappear at a recombination center at the grain boundary in a short time. Regarding the remaining carriers including carriers present on the cathode side, electrons are discharged from the cathode electrode and holes are discharged from the anode electrode. A part of electrons and holes recombine to disappear, the implanted carriers finally disappear and PIN diode 2 is turned off.

Figure 34:
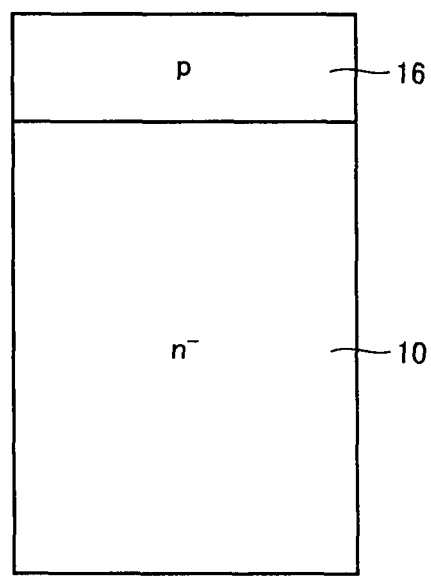
FIG. 34 is a cross section showing a step of a method of manufacturing the PIN diode in the embodiment.
Figure 35:
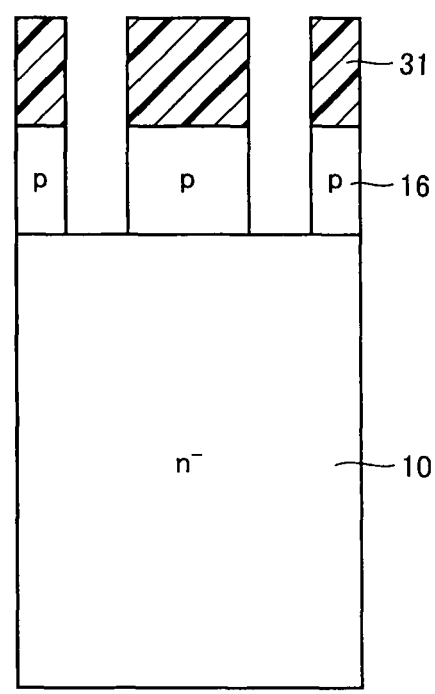
FIGS. 35 and 36 are respectively cross sections showing respective steps performed after respective steps shown in FIGS. 34 and 35 in the embodiment.

An example of the method of manufacturing the above-described PIN diode will be described. Through steps similar to those shown in FIGS. 29 and 30, as shown in FIG. 34, p-type polysilicon film 16 is formed on one surface of n⁻-type silicon substrate 10. As shown in FIG. 35, resist pattern 31 is formed on a surface of p-type polysilicon film 16. Resist pattern 31 is used as a mask to anisotropically etch p-type polysilicon film 16. Accordingly, a part of p-type polysilicon film 16 is left in a predetermined region and a part of p-type polysilicon film 16 that is located in the other region is removed to expose a surface of n⁻-type silicon substrate 10. Resist pattern 31 is thereafter removed.

Figure 36:
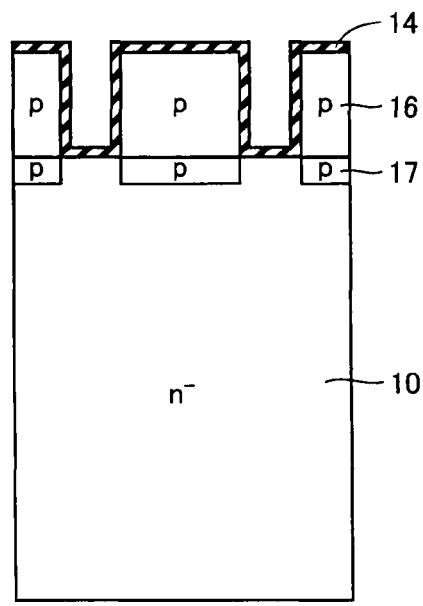

Then, as shown in FIG. 36, predetermined heat treatment is performed to thermally diffuse p-type impurities in p-type polysilicon film 16 into n⁻-type silicon substrate 10 and selectively form p-type region 17. On the exposed surface of n⁻-type silicon substrate 10 and on the surface of p-type polysilicon film 16, insulating film 14 is formed. After this, through steps similar to the above-described steps shown in FIGS. 20, 12 and 13, PIN diode 2 shown in FIG. 32 is completed.

Regarding PIN diode 2 described above, since p-type polysilicon film 16 having a grain boundary is formed in an anode-side region where the carrier density is relatively high, the carriers present in the region can be caused to disappear at the grain boundary in a short time. The lifetime of PIN diode 2 can be shortened and the state of PIN diode 2 can be more speedily changed from the ON state to the OFF state.

Moreover, thickness t of p-type polysilicon film 16 may be changed and additionally p-type polysilicon film 16 may be selectively formed to change area S (see FIG. 33) of the region where it is formed, so that the lifetime of PIN diode 2 can be controlled more precisely. While the switching characteristic is ensured, the ON resistance can be reduced.

In other words, regarding this PIN diode 2, according to characteristics of an inverter apparatus for example to which PIN diode 2 is applied, the area of the region where p-type polysilicon film 16 serving as a recombination center of carriers and the thickness of the polysilicon film for example can be changed to more precisely control the lifetime of PIN diode 2. Thus, while the switching characteristic is ensured, the ON resistance can be reduced.

Sixth Embodiment

A description will be given of a sixth example of the PIN diode having its anode side where a polysilicon film with a grain boundary is formed as a predetermined film having a crystal defect which serves as a recombination center.

Figure 37:
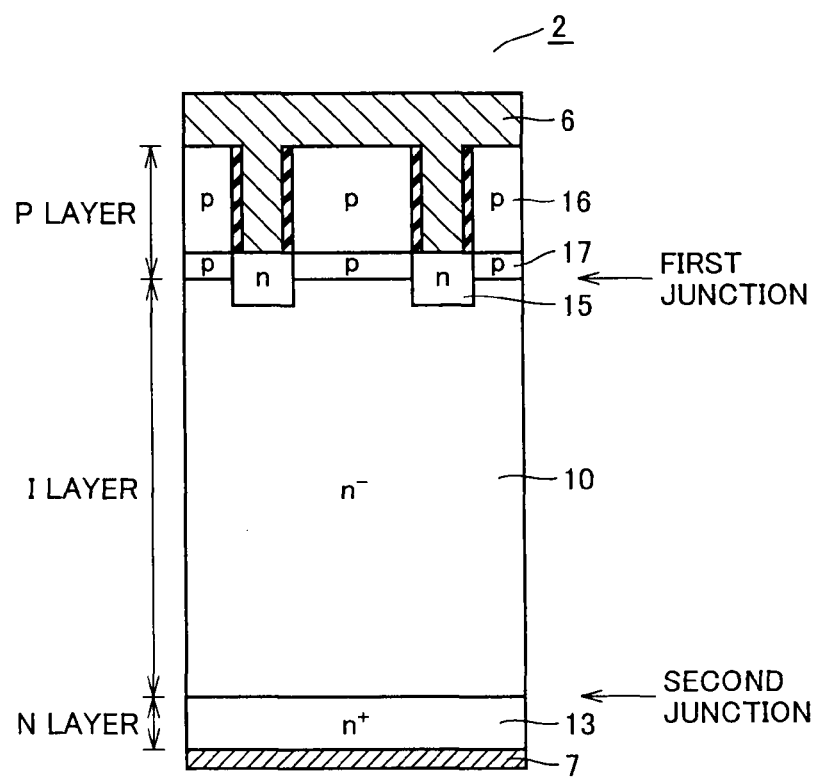
FIG. 37 is a cross section showing a configuration of a PIN diode according to a sixth embodiment of the present invention.

As shown in FIG. 37, on one main surface of n⁻-type silicon substrate 10, p-type polysilicon film 16 is selectively formed. In a portion of n⁻-type silicon substrate 10 that is located immediately under p-type polysilicon film 16, p-type region 17 is selectively formed to a predetermined depth from the surface of n⁻-type silicon substrate 10 in such a manner that p-type region 17 corresponds to p-type polysilicon film 16. In a portion of n⁻-type silicon substrate 10 that is located in the region where p-type polysilicon film 16 is not formed, an n-type region 15 (sixth region) is formed. Components and features other than the above-described ones are similar to those of the PIN diode shown in FIG. 32. Like components are denoted by like reference characters and the description thereof will not be repeated.

This PIN diode is configured similarly to the PIN diode shown in FIG. 32 except that n-type region 15 is formed. Further, the graph (distribution) of the carrier density in the forward bias state of PIN diode 2 including the region where p-type polysilicon film 16 is formed is substantially identical to the graph of the carrier density shown in FIG. 27.

Figure 38:
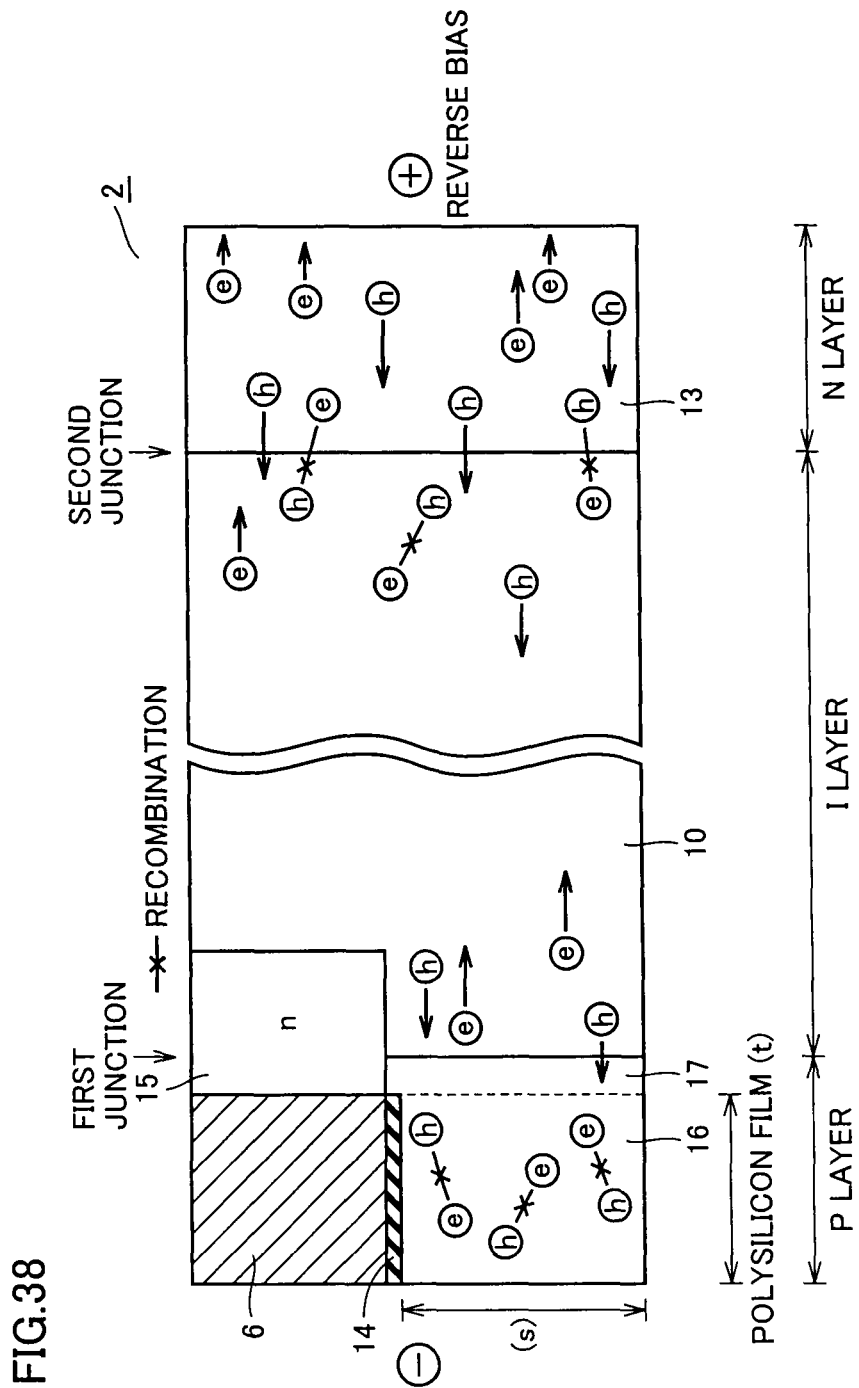
FIG. 38 illustrates behavior of carriers in a reverse bias state of the PIN diode in the embodiment.

The behavior of carriers in the reverse bias state of PIN diode 2 is also substantially identical to that of the PIN diode shown in FIG. 32. As shown in FIG. 38, when a reverse bias voltage is applied to PIN diode 2, carriers that are a part of implanted carriers and that are present in p-type polysilicon film 16 disappear at a recombination center at the grain boundary in a short time. Regarding the remaining carriers including carriers present on the cathode side, electrons are discharged from the cathode electrode and holes are discharged from the anode electrode. A part of electrons and holes recombine to disappear. The implanted carriers finally disappear and the PIN diode 2 is turned off.

Figure 39:
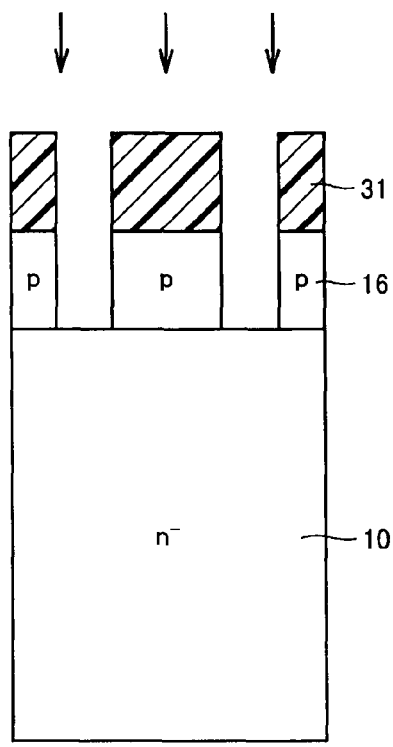
FIG. 39 is a cross section showing a step of a method of manufacturing the PIN diode in the embodiment.

One example of the method of manufacturing the above-described PIN diode will be described. After steps similar to the above-described steps shown in FIGS. 29, 30, 34 and 35, resist pattern 31 is used as a mask to implant n-type impurities to the exposed surface of n⁻-type silicon substrate 10 by the ion implantation as shown in FIG. 39. Resist pattern 31 is thereafter removed.

Figure 40:
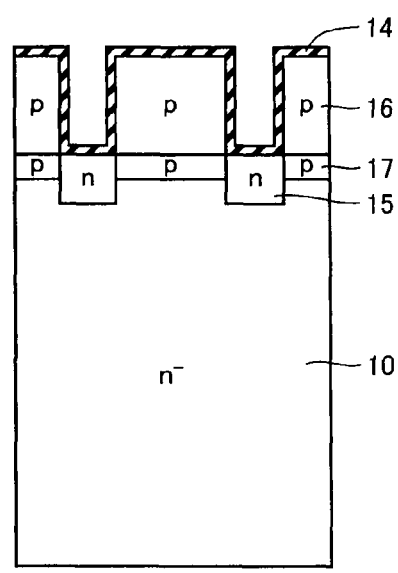
FIG. 40 is a cross section showing a step performed after the step shown in FIG. 39 in the embodiment.

Then, as shown in FIG. 40, predetermined heat treatment is performed to thermally diffuse p-type impurities in p-type polysilicon film 16 into n⁻-type silicon substrate 10 and thereby selectively form p-type region 17. Further, the n-type impurities implanted to exposed n⁻-type silicon substrate 10 are thermally diffused to form n-type region 15. Furthermore, on the exposed surface of n⁻-type silicon substrate 10 and on the surface of polysilicon film 16, insulating film 14 is formed. After this, through steps similar to the above-described steps in FIGS. 20, 12 and 13, PIN diode 2 shown in FIG. 37 is completed.

Regarding PIN diode 2 as described above, particularly n-type region 15 is formed so that the ratio of holes and electrons recombining to disappear in the reverse bias state increases. Further, the absolute amount of electrons that are to be caused to disappear can be reduced. Thus, the thickness of p-type polysilicon film 16 and the region where it is formed may be changed and additionally n-type region 15 may be formed to more precisely change the ratio of the carriers recombining to disappear to the whole implanted carriers.

In other words, regarding PIN diode 2, according to characteristics of an inverter apparatus for example to which PIN diode 2 is applied, the area of the region where p-type polysilicon film 16 is formed and the thickness of the film for example may be changed and further n-type region 15 may be formed to precisely control the lifetime of PIN diode 2. While the switching characteristic is ensured, the ON resistance can be reduced.

Seventh Embodiment

A description will be given of a first example of a PIN diode having its cathode side where a polysilicon film with a grain boundary is formed as a predetermined film having a crystal defect serving as a recombination center.

Figure 41:
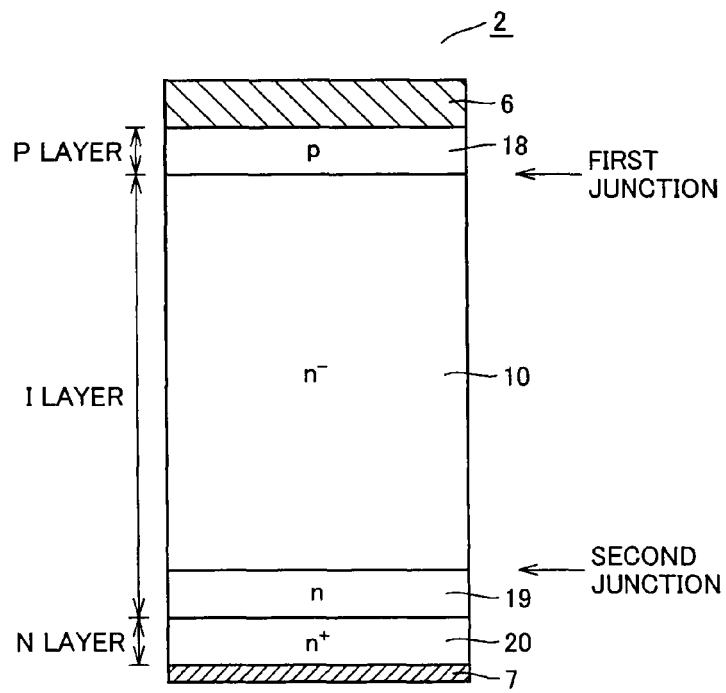
FIG. 41 is a cross section showing a configuration of a PIN diode according to a seventh embodiment of the present invention.

As shown in FIG. 41, on one main surface of n⁻-type silicon substrate ($\rho n=1\times 10^{13}$-$1\times 10^{15}$/cm³, tn=10-700 μm) 10, a p-type region 18 ($N=1\times 10^{14}$-$1\times 10^{17}$/cm³, Xj=0.5-5 μm) is formed to a predetermined depth from the surface. In contact with the surface of p-type region 18, anode electrode 6 electrically connected to p-type region 18 is formed. On the other main surface of n⁻-type silicon substrate 10, an n-type polysilicon film of a predetermined thickness ($N=1\times 10^{14}$-$1\times 10^{16}$/cm³) 19 (seventh region) is formed. On n-type polysilicon film 19, an n⁺-type polysilicon film ($N=1\times 10^{15}$-$1\times 10^{19}$/cm³, Xj=0.5-5 μm) 20 (second region) is formed. In contact with the surface of n⁺-type polysilicon film 20, cathode electrode 7 electrically connected to n⁺-type polysilicon film 20 is formed.

In PIN diode 2, the P layer is formed of p-type region 18, the I layer is formed of n-type polysilicon film 19 and n⁻-type silicon substrate 10, and the N layer is formed of n⁺-type polysilicon film 20. Further, the junction between p-type region 18 and n⁻-type silicon substrate 10 is a first junction (pn junction) and the junction between n-type polysilicon film 19 and n⁺-type polysilicon film 20 is a second junction (n⁺n junction).

Figure 42:
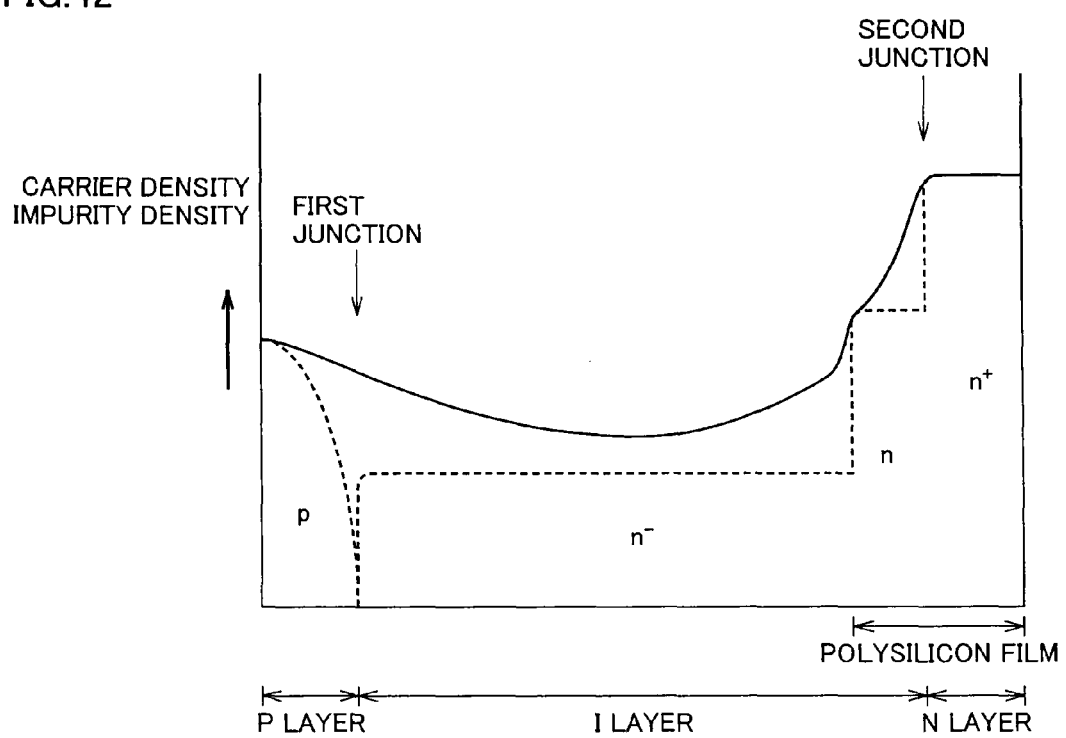
FIG. 42 is a graph showing a carrier density distribution in a forward bias state of the PIN diode in the embodiment.

Thus, in PIN diode 2, n-type polysilicon film 19 and n⁺-type polysilicon film 20 having a grain boundary serving as a recombination center is formed to include the n⁺n junction on the cathode side. The graph (distribution) of the carrier density in the forward bias state of PIN diode 2 is shown in FIG. 42. As shown in FIG. 42, the graph (solid line) of the carrier density in the forward bias state is substantially a curve of hyperbolic function connecting an end of the anode side and an end of the cathode side. The carrier density on the anode side is identical to the impurity density of p-type region 18 while the carrier density on the cathode side is identical to the impurity density of n⁺-type polysilicon film 20. The broken line represents the impurity density of each region which is a component of the PIN diode.

Figure 43:
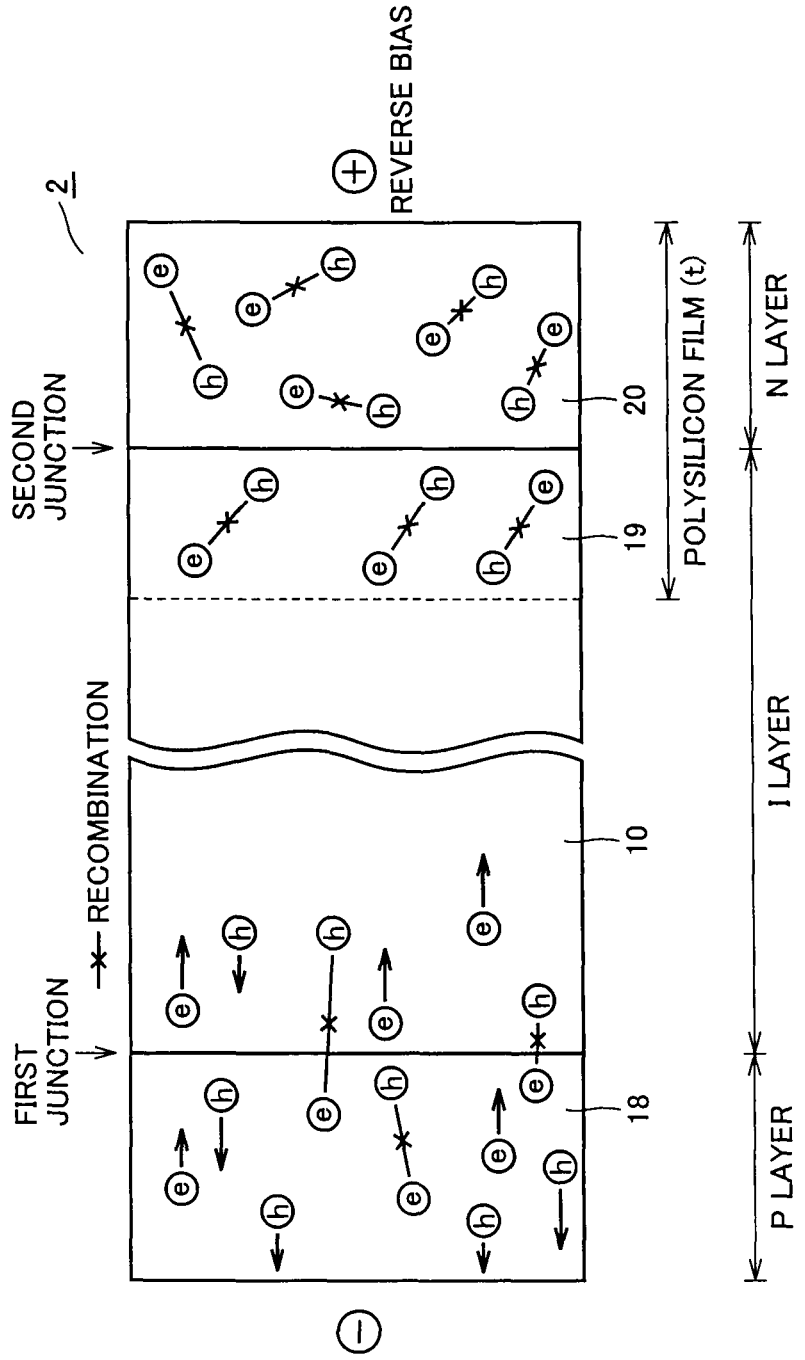
FIG. 43 illustrates behavior of carriers in a reverse bias state of the PIN diode in the embodiment.

Behavior of carriers in the reverse bias state of PIN diode 2 will be described. As shown in FIG. 43, as a reverse bias voltage is applied to PIN diode 2, carriers that are a part of implanted carriers and that are present in the polysilicon film (n-type polysilicon film 19 and n⁺-type polysilicon film 20) disappear at a recombination center at the grain boundary in a short time. Regarding remaining carriers including carriers present on the cathode side, electrons are discharged from the cathode electrode and holes are discharged from the anode electrode. A part of electrons and holes recombine to disappear. The implanted carriers finally disappear. PIN diode 2 is thus turned off.

Figure 44:
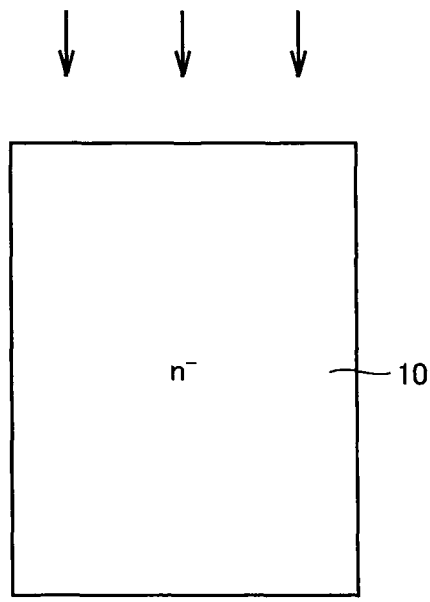
FIG. 44 is a cross section showing a step of a method of manufacturing the PIN diode in the embodiment.
Figure 45:
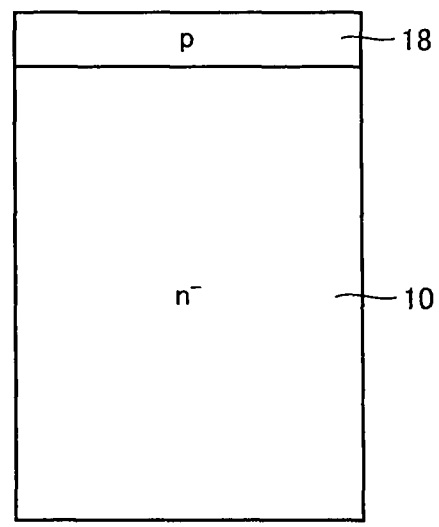
FIGS. 45 to 50 are respectively cross sections showing respective steps performed after respective steps shown in FIGS. 44 to 49 in the embodiment.
Figure 46:
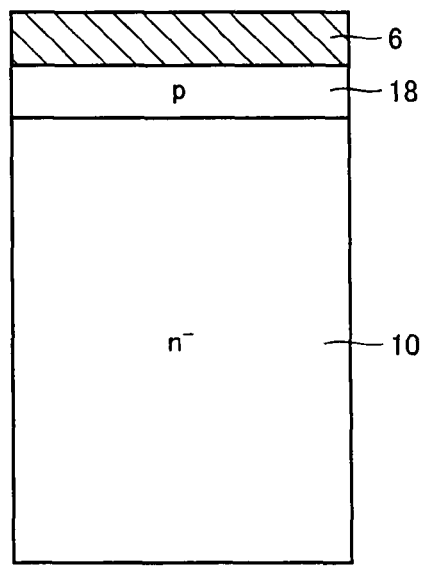

An example of a method of manufacturing the above-described PIN diode will be described. As shown in FIG. 44, to one surface of n⁻-type silicon substrate 10, p-type impurities are implanted by the ion implantation. As shown in FIG. 45, predetermined heat treatment is performed to thermally diffuse the p-type impurities and thereby form p-type region 18. Thus, the pn junction is formed by n⁻-type silicon substrate 10 and p-type region 18. As shown in FIG. 46, anode electrode 6 electrically connected to p-type region 18 is formed to be in contact with a surface of p-type region 18.

Figure 47:
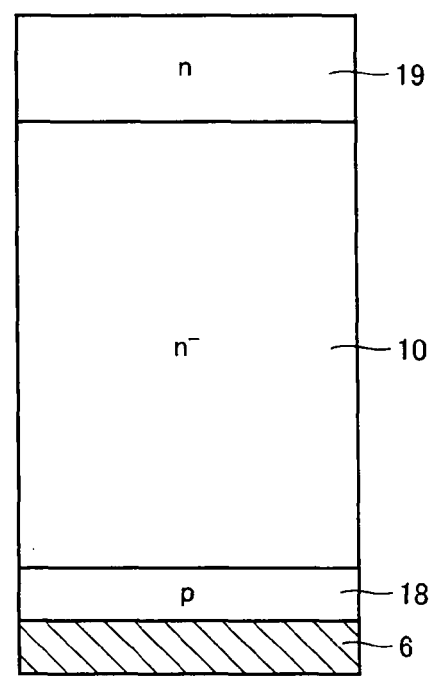
Figure 48:
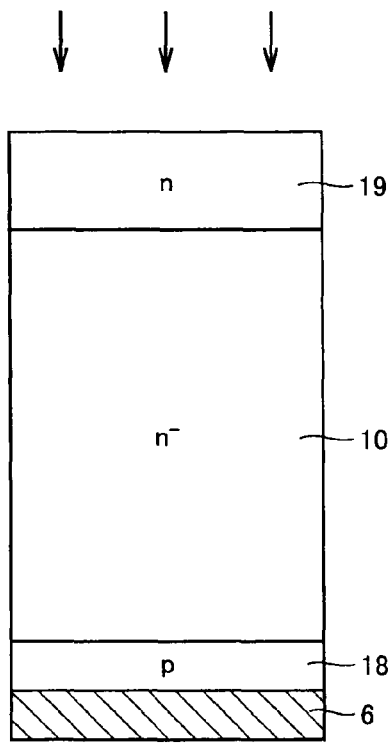
Figure 49:
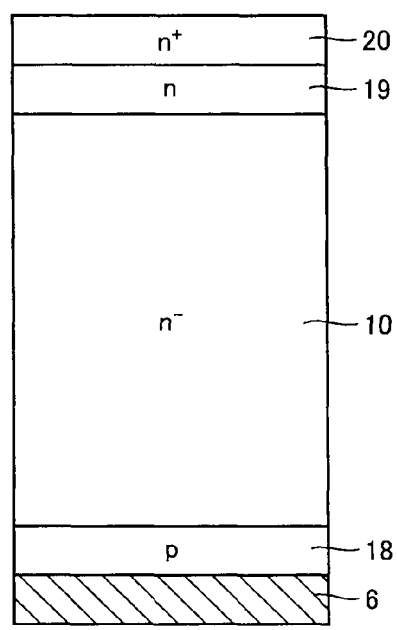
Figure 50:
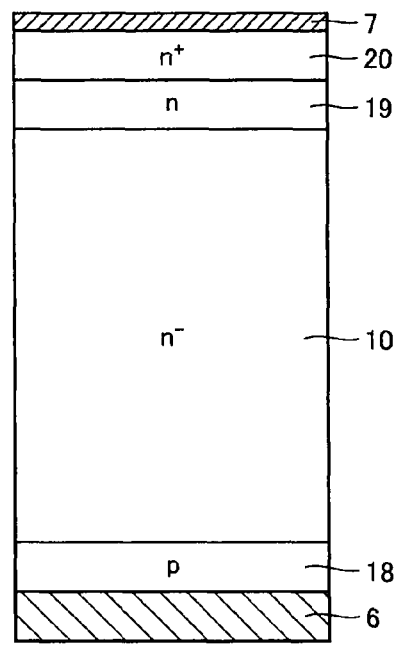

As shown in FIG. 47, on the other surface of n⁻-type silicon substrate 10, n-type polysilicon film 19 which is n-type doped is formed. As shown in FIG. 48, n-type impurities are implanted to n-type polysilicon film 19 by the ion implantation. As shown in FIG. 49, predetermined heat treatment is performed to thermally diffuse the n-type impurities and thereby form n⁺-type polysilicon film 20. As shown in FIG. 50, on a surface of n⁺-type polysilicon film 20, cathode electrode 7 is formed. In this way, PIN diode 2 shown in FIG. 41 is completed.

In the above-described PIN diode 2, in the region of a relatively high carrier density on the cathode side, n-type polysilicon film 19 and n⁺-type polysilicon film 20 having a grain boundary is formed. Thus, carriers that are present in the region of the relatively high carrier density can be caused to disappear at the grain boundary in a short time and thus the lifetime of PIN diode 2 can be shortened and the state of PIN diode 2 can be more speedily changed from the ON state to the OFF state. Further, by changing thickness t and grain size for example of n-type polysilicon film 19 and n⁺-type polysilicon film 20, the number of recombination centers increases or decreases. Thus, the ratio of carriers recombining to disappear to the whole implanted carriers can precisely be changed.

In other words, regarding PIN diode 2, according to characteristics of an inverter apparatus for example to which PIN diode 2 is applied, the area of the region where the polysilicon film serving as a recombination center of carriers (n-type polysilicon film 19 and n⁺-type polysilicon film 20) is formed and the thickness of the polysilicon film for example can be changed to more precisely control the lifetime of PIN diode 2. While the switching characteristic is ensured, the ON resistance can be reduced.

Eighth Embodiment

A description will be given of a second example of the PIN diode having its cathode side where a polysilicon film with a grain boundary is formed as a predetermined film having a crystal defect serving as a recombination center.

Figure 51:
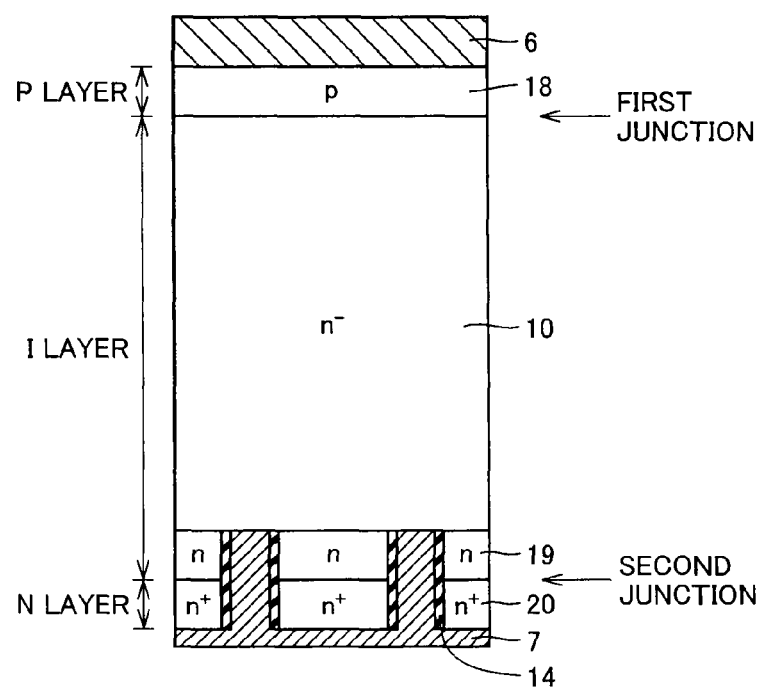
FIG. 51 is a cross section showing a configuration of a PIN diode according to an eighth embodiment of the present invention.

As shown in FIG. 51, on one main surface of n⁻-type silicon substrate 10, a p-type region 18 is formed to a predetermined depth from the surface. On the other main surface of n⁻-type silicon substrate 10, n-type polysilicon film 19 and n⁺-type polysilicon film 20 of a predetermined thickness are selectively formed. On the sidewalls of n-type polysilicon film 19 and n⁺-type polysilicon film 20, insulating film 14 is formed. Cathode electrode 7 is formed to be in contact with the surface of n⁻-type silicon substrate 10 that is exposed to the region where n-type polysilicon film 19 and n⁺-type polysilicon film 20 are not formed and in contact with the surface of n⁺-type polysilicon film 20. Components and features other than the above-described ones are similar to those of the PIN diode shown in FIG. 41. Therefore, like components are denoted by like reference characters and the description thereof will not be repeated.

In PIN diode 2, n-type polysilicon film 19 and n⁺-type polysilicon film 20 having a grain boundary serving as a recombination center are selectively formed on the cathode side to include the n⁺n junction. The graph (distribution) of the carrier density in the forward bias state of PIN diode 2 including the region where n-type polysilicon film 19 and n⁺-type polysilicon film 20 are formed is substantially the same as the graph of the carrier density shown in FIG. 42.

Figure 52:
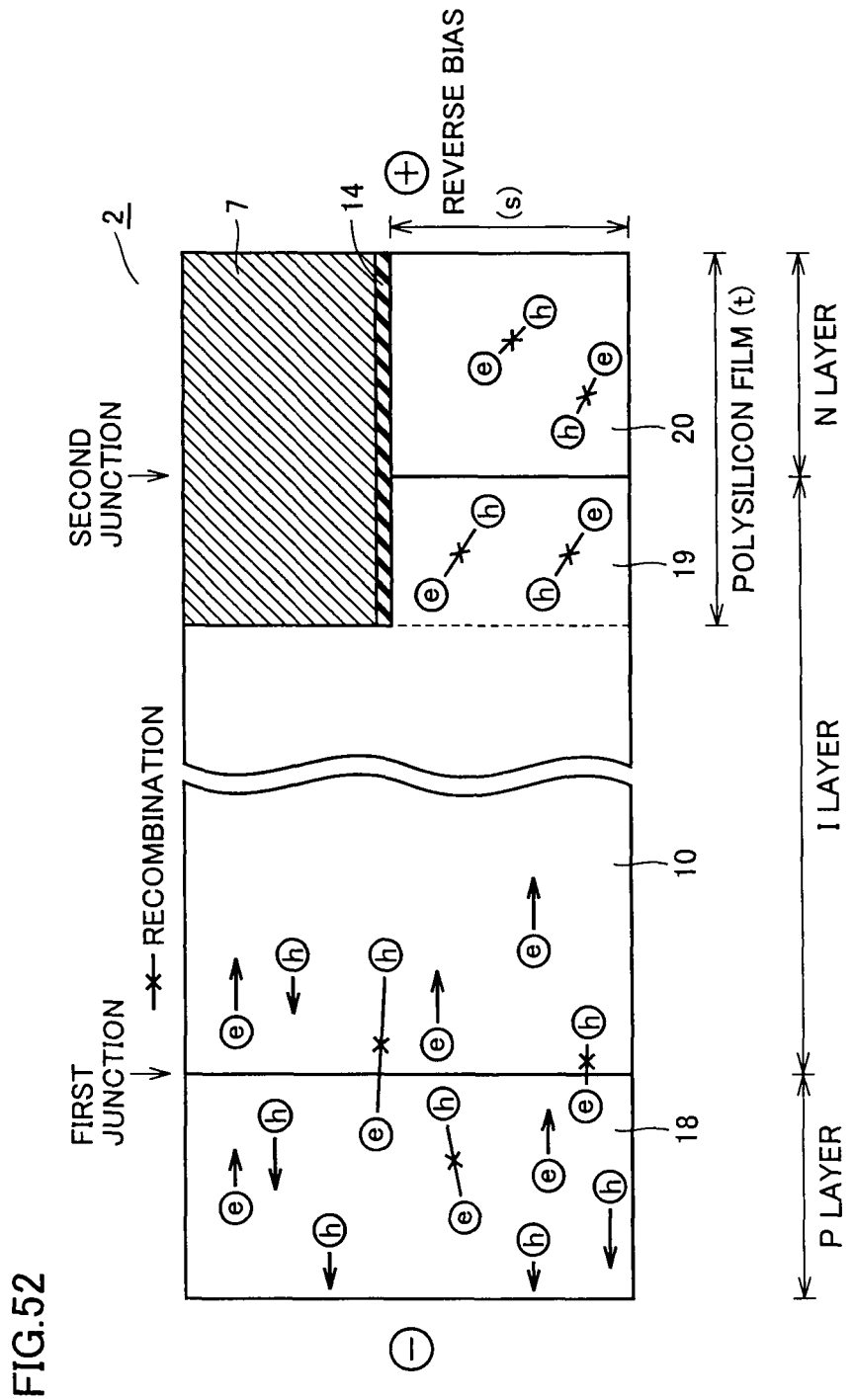
FIG. 52 illustrates behavior of carriers in a reverse bias state of the PIN diode in the embodiment.

Behavior of carriers in the reverse bias state of PIN diode 2 will be described. As shown in FIG. 52, as a reverse bias voltage is applied to PIN diode 2, carriers that are a part of implanted carriers and that are present in the polysilicon film (n-type polysilicon film 19 and n$^+$-type polysilicon film 20) disappear at a recombination center at the grain boundary in a short time. Regarding the remaining carriers including carriers present on the anode side, electrons are discharged from the cathode electrode and holes are discharged from the anode electrode. A part of electrons and holes recombine to disappear. The implanted carriers finally disappear and PIN diode 2 is turned off.

Figure 53:
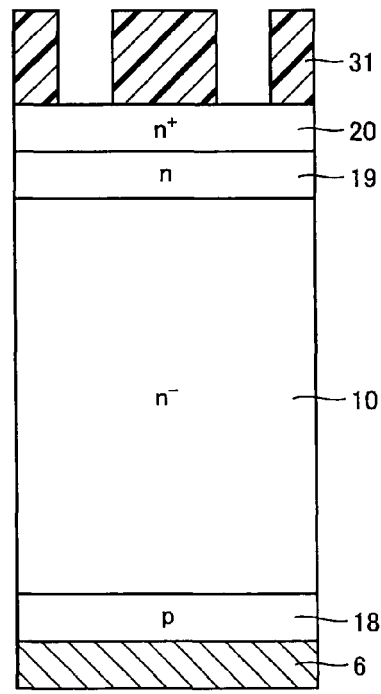
FIG. 53 is a cross section showing a step of a method of manufacturing the PIN diode in the embodiment.
Figure 54:
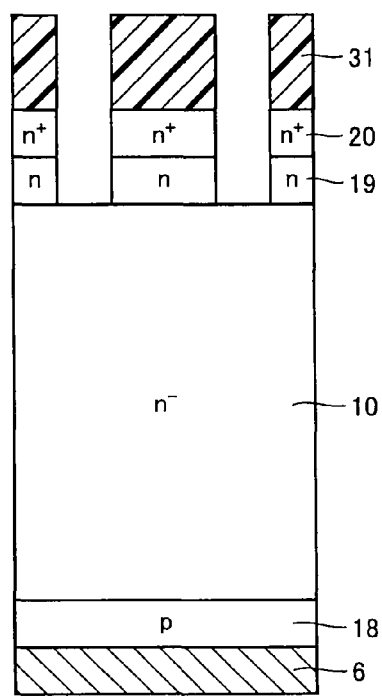
FIGS. 54 to 56 are respectively cross sections showing respective steps performed after respective steps shown in FIGS. 53 to 55 in the embodiment.

An example of the method of manufacturing the above-described PIN diode will be described. After steps similar to above-described steps shown in FIGS. 44 to 49, resist pattern 31 is formed on a surface of n$^+$-type polysilicon film 20 as shown in FIG. 53. As shown in FIG. 54, resist pattern 31 is used as a mask to anisotropically etch n$^+$-type polysilicon film 20 and n-type polysilicon film 19 successively so as to leave n$^+$-type polysilicon film 20 and n-type polysilicon film 19 only in a predetermined region, while removing the part of n$^+$-type polysilicon film 20 and n-type polysilicon film 19 located in the remaining region. Thus, a surface of n$^-$-type silicon substrate 10 is exposed. Resist pattern 31 is thereafter removed.

Figure 55:
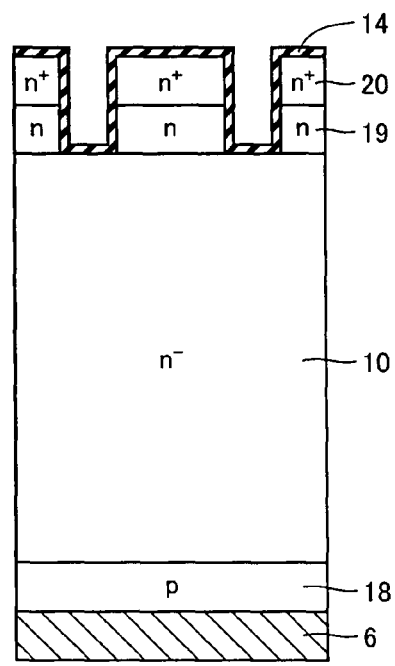
Figure 56:
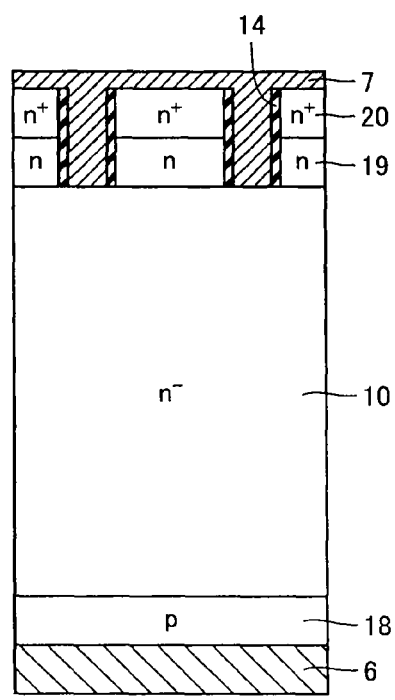

As shown in FIG. 55, predetermined heat treatment is performed to form insulating film 14 on respective exposed surfaces of n$^-$-type silicon substrate 10, n$^+$-type polysilicon film 20 and n-type polysilicon film 19. Insulating film 14 is anisotropically etched to leave the portion of insulating film 14 located on respective side surfaces of n$^+$-type polysilicon film 20 and n-type polysilicon film 19 and remove the other portion of insulating film 14. As shown in FIG. 56, cathode electrode 7 is formed. In this way, the PIN diode shown in FIG. 51 is completed.

Regarding PIN diode 2 as described above, since n-type polysilicon film 19 and n$^+$-type polysilicon film 20 having a grain boundary is formed in the region of a relatively high carrier density on the cathode side. Therefore, carriers present in this region can be caused to disappear at the grain boundary in a short time. Thus, the lifetime of PIN diode 2 can be shortened and the state of PIN diode 2 can be changed more speedily from the ON state to the OFF state.

Moreover, thickness t of n-type polysilicon film 19 and n$^+$-type polysilicon film 20 can be changed and additionally these polysilicon films can be selectively formed so as to change area S of the region where the films are formed (see FIG. 52). Thus, the ratio of carriers recombining to disappear to the whole implanted carriers can be changed more precisely.

In other words, regarding PIN diode 2, according to characteristics of an inverter apparatus for example to which PIN diode 2 is applied, the area of the region where the polysilicon film (n-type polysilicon film 19 and n$^+$-type polysilicon film 20) serving as a recombination center of carriers is formed and thickness of the polysilicon film for example can be changed to more precisely control the lifetime of PIN diode 2 and reduce the ON resistance while ensuring the switching characteristic.

Ninth Embodiment

A description will be given of a third example of the PIN diode having its cathode side where a polysilicon film with a grain boundary is formed as a predetermined film having a crystal defect serving as a recombination center.

Figure 57:
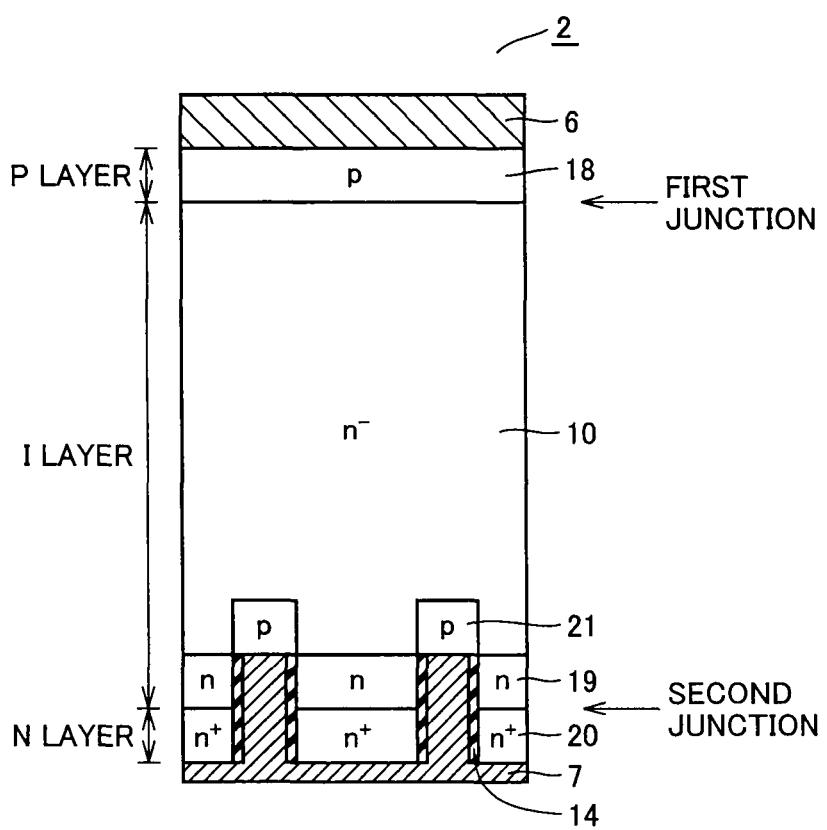
FIG. 57 is a cross section showing a configuration of a PIN diode according to a ninth embodiment of the present invention.

As shown in FIG. 57, on one main surface of n$^-$-type silicon substrate 10, p-type region 18 is formed to a predetermined depth from the surface. On the other main surface of n$^-$-type silicon substrate 10, n-type polysilicon film 19 and n$^+$-type polysilicon film 20 are selectively formed. In a portion of n$^-$-type silicon substrate 10 that is located in the region where n-type polysilicon film 19 and n$^+$-type polysilicon film 20 are not formed, a p-type region (N=1×10$^{17}$/cm$^3$, Xj=0.5-5 µm) 21 (eighth region) is formed.

This PIN diode is configured similarly to the PIN diode shown in FIG. 51 except that p-type region 21 is formed. Further, the graph (distribution) of the carrier density in the forward bias state of PIN diode 2 including the region where n-type polysilicon film 19 and n$^+$-type polysilicon film 20 are formed is substantially identical to the graph of the carrier density shown in FIG. 42.

Figure 58:
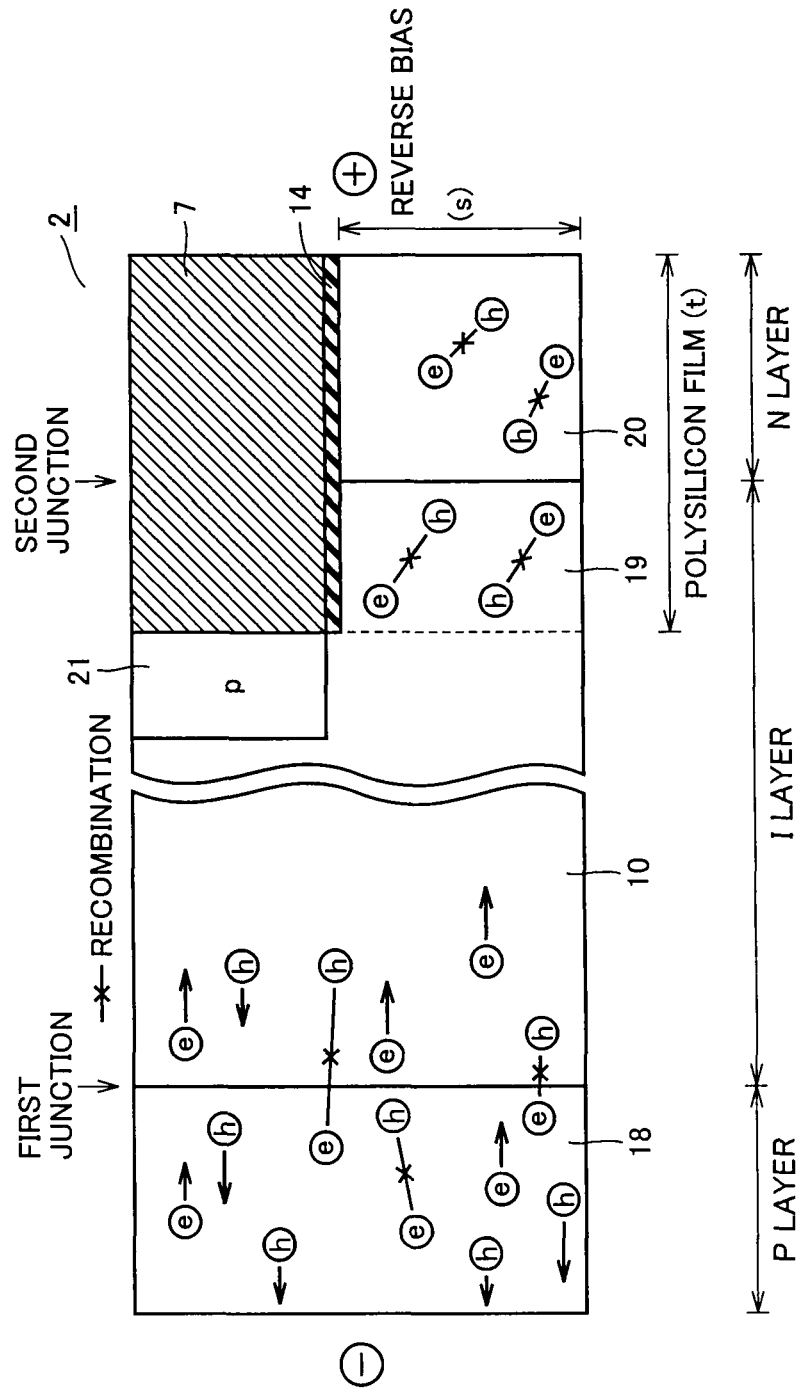
FIG. 58 illustrates behavior of carriers in a reverse bias state of the PIN diode in the embodiment.

Behavior of carriers in the reverse bias state of PIN diode 2 is also substantially identical to that of the PIN diode shown in FIG. 51. As shown in FIG. 58, as a reverse bias voltage is applied to PIN diode 2, carriers that are a part of implanted carriers and that are present in the polysilicon film (n-type polysilicon film 19 and n$^+$-type polysilicon film 20) disappear at a recombination center at the grain boundary in a short time. Regarding the remaining carriers including carriers present on the anode side, electrons are discharged from the cathode electrode and holes are discharged from the anode electrode. A part of electrons and holes recombine to disappear. The implanted carriers finally disappear and PIN diode 2 is turned off.

Figure 59:
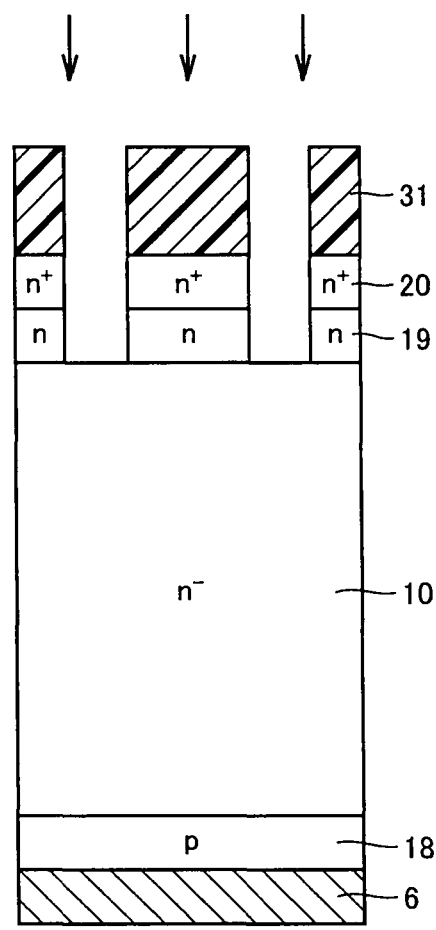
FIG. 59 is a cross section showing a step of a method of manufacturing the PIN diode in the embodiment.

An example of the method of manufacturing the above-described PIN diode will be described. After steps similar to the above-described steps shown in FIGS. 44 to 49, 53 and 54, resist pattern 31 is used as a mask as shown in FIG. 59 to implant p-type impurities by the ion implantation to the exposed surface of n$^-$-type silicon substrate 10. Resist pattern 31 is thereafter removed.

Figure 60:
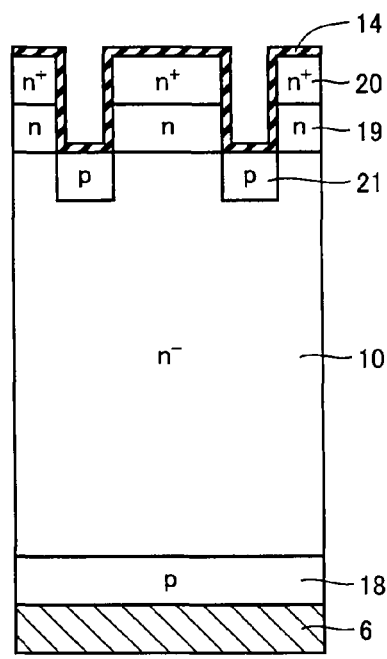
FIG. 60 is a cross section showing a step performed after the step shown in FIG. 59 in the embodiment.

As shown in FIG. 60, predetermined heat treatment is performed to form insulating film 14 on respective exposed surfaces of n$^-$-type silicon substrate 10, n-type polysilicon film 19 and n$^+$-type polysilicon film 20. The implanted p-type impurities are thermally diffused to form p-type region 21. After this, through a step similar to the above-described step shown in FIG. 56, PIN diode 2 shown in FIG. 57 is completed.

Regarding PIN diode 2 described above, particularly p-type region 21 is formed so that the ratio of electrons recombining with holes to disappear in the reverse bias state increases. Since holes are left at the pn junction interface between p-type region 21 and n$^-$-type silicon substrate 10, the reduction rate of the reverse recovery current can be decreased (soft recovery). Thus, the thickness of the polysilicon film and the area of the region where the polysilicon film is formed may be changed and additionally p-type region 21 may be formed to more precisely change the ratio of carriers recombining to disappear to the whole implanted carriers, and accomplish the soft recovery.

In other words, regarding PIN diode 2, according to characteristics of an inverter apparatus for example to which PIN diode 2 is applied, the area of the region where the polysilicon film (n-type polysilicon film 19 and n$^+$-type polysilicon film 20) serving as a carrier recombination center as well as the thickness for example of the polysilicon film are changed and further p-type region 21 is formed so that the lifetime of PIN diode 2 is more precisely controlled and the ON resistance can be reduced while ensuring the switching characteristic. Moreover, as a reverse bias voltage is applied, soft recovery can be accomplished.

Figure 61:
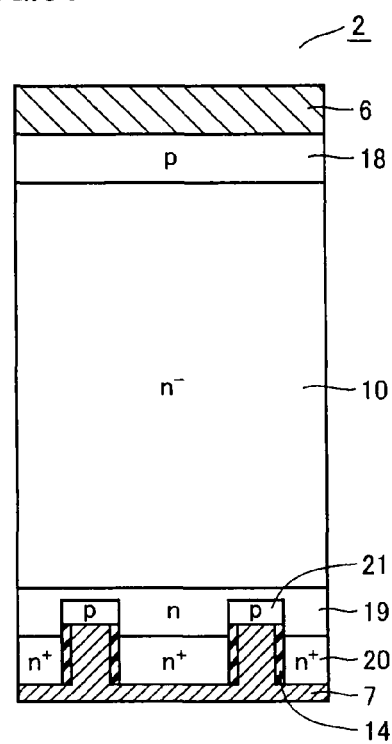
FIG. 61 is a cross section showing a configuration of a PIN diode according to a modification of the embodiment.
Figure 62:
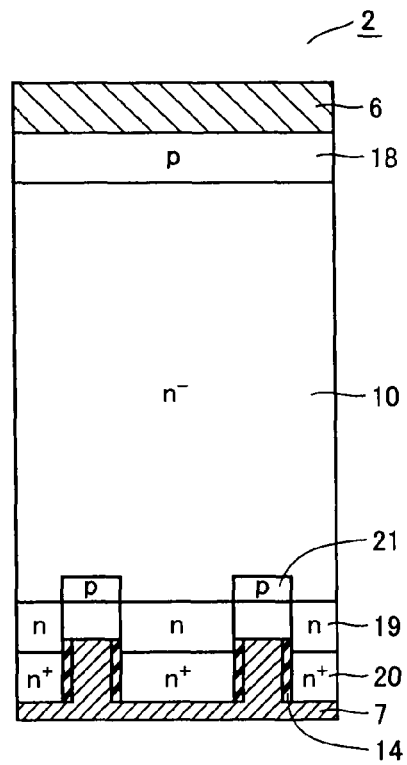
FIG. 62 is a cross section showing a configuration of a PIN diode according to another modification of the embodiment.

The method of manufacturing the PIN diode is described above using an example of the case where n$^+$-type polysilicon film 20 and n-type polysilicon film 19 are anisotropically etched to expose a surface of n$^-$-type silicon substrate 10 (just etching). The manner of etching is not limited to this. For example, as shown in FIG. 61, etching may be performed to leave a part of n-type polysilicon film 19 to selectively form a relatively thick portion and a relatively thin portion and form p-type region 21 in n-type polysilicon film 19. Alternatively, as shown in FIG. 62, n-type polysilicon film 19 may be similarly etched to form p-type region 21 reaching the region of n⁻-type silicon substrate 10. In these cases as well, similar effects can be achieved.

Tenth Embodiment

A description will be given of a fourth example of the PIN diode having its cathode side where a polysilicon film with a grain boundary is formed as a predetermined film having a crystal defect serving as a recombination center.

Figure 63:
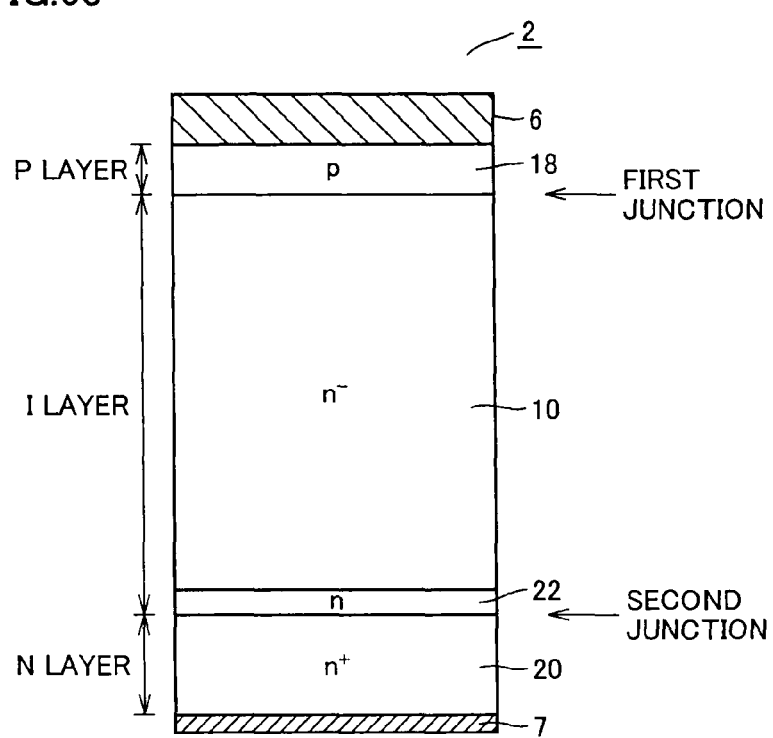
FIG. 63 is a cross section showing a configuration of a PIN diode according to a tenth embodiment of the invention.

As shown in FIG. 63, on one main surface of n⁻-type silicon substrate 10, p-type region 18 is formed to a predetermined depth from the surface. In contact with the surface of p-type region 18, anode electrode 6 electrically connected to p-type region 18 is formed. On the other main surface of n⁻-type silicon substrate 10, an n-type region 22 (ninth region) is formed to a predetermined depth from the surface. On the surface of n-type region 22, n⁺-type polysilicon film 20 is formed. In contact with the surface of n⁺-type polysilicon film 20, cathode electrode 7 electrically connected to n⁺-type polysilicon film 20 is formed.

In PIN diode 2, the P layer is formed of p-type region 18, the I layer is formed of n⁻-type silicon substrate 10 and n-type region 22 and the N layer is formed of n⁺-type polysilicon film 20. Further, the junction between p-type region 18 and n⁻-type silicon substrate 10 is a first junction (pn junction) and the junction between n⁻-type silicon substrate 10 and n⁺-type polysilicon film 20 is a second junction (n⁺n junction).

Figure 64:
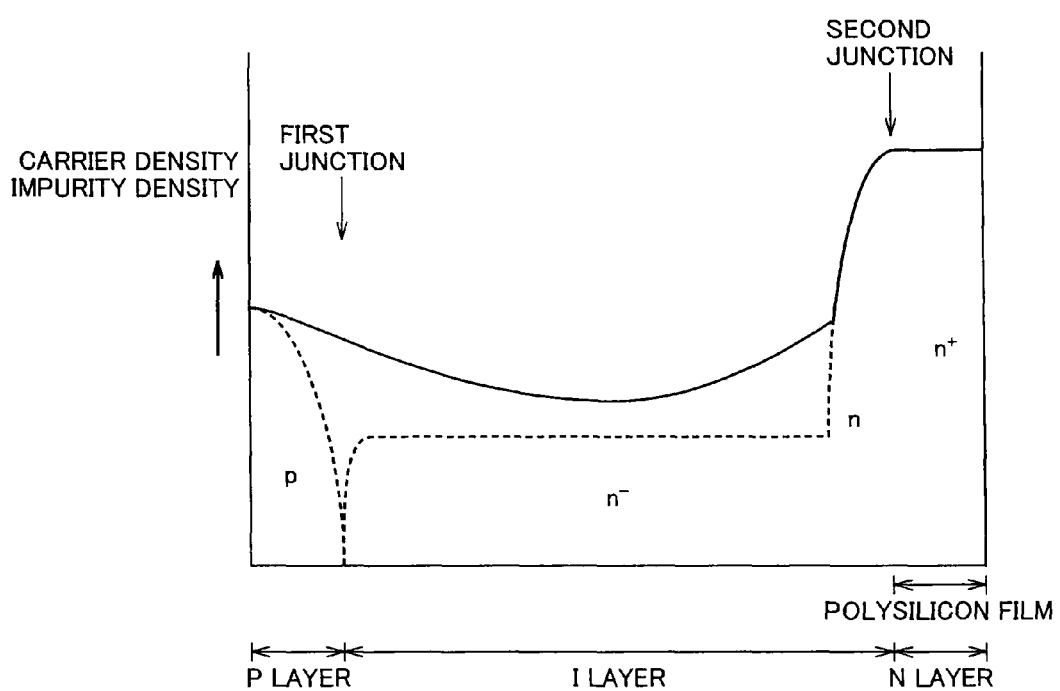
FIG. 64 is a graph showing a carrier density distribution in a forward bias state of the PIN diode in the embodiment.

Thus, in PIN diode 2, n⁺-type polysilicon film 20 having a grain boundary serving as a recombination center is formed on the cathode side to be in contact with the n⁺n junction. The graph (distribution) of the carrier density in the forward bias state of PIN diode 2 is shown in FIG. 64. As shown in FIG. 64, the graph (solid line) of the carrier density in the forward bias state is substantially a curve of the hyperbolic function connecting an end of the anode side and an end of the cathode side. The carrier density on the anode side is identical to the impurity density of p-type region 18, and the carrier density on the cathode side is identical to the impurity density of n⁺-type polysilicon film 20. The broken line represents the impurity density of each region that is a component of the PIN diode.

Figure 65:
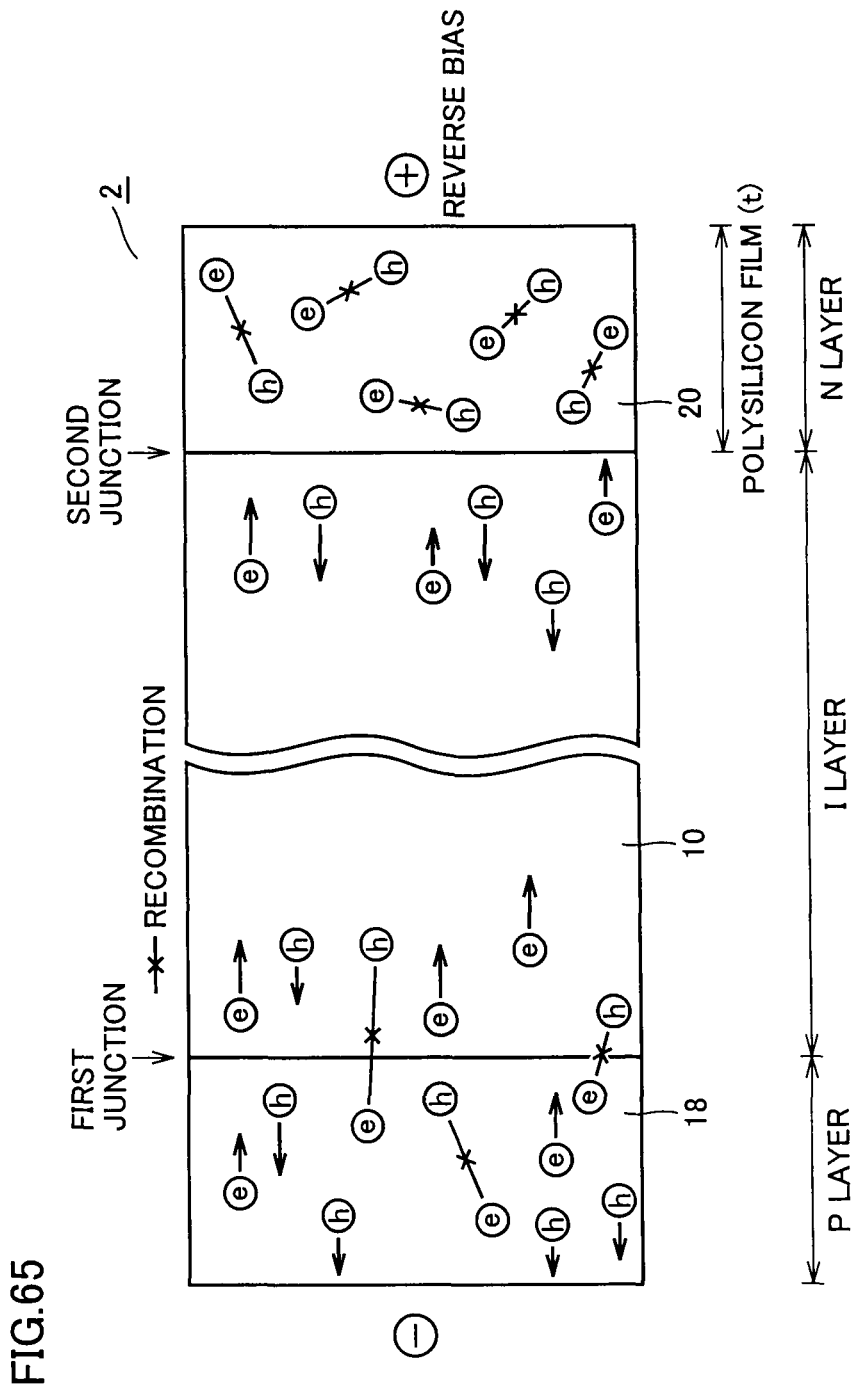
FIG. 65 illustrates behavior of carriers in a reverse bias state of the PIN diode in the embodiment.

Behavior of carriers in the reverse bias state of PIN diode 2 will be described. As shown in FIG. 65, as a reverse bias voltage is applied to PIN diode 2, carriers that are a part of implanted carriers and that are present in n⁺-type polysilicon film 20 disappear at a recombination center at the grain boundary in a short time. Regarding remaining carriers including carriers present on the anode side, electrons are discharged from the cathode electrode and holes are discharged from the anode electrode. A part of electrons and holes recombine to disappear and the implanted carriers finally disappear. PIN diode 2 is thus turned off.

Figure 66:
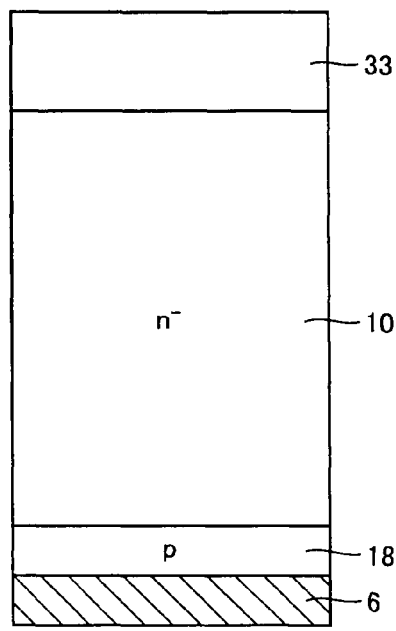
FIG. 66 is a cross section showing a step of a method of manufacturing the PIN diode in the embodiment.
Figure 67:
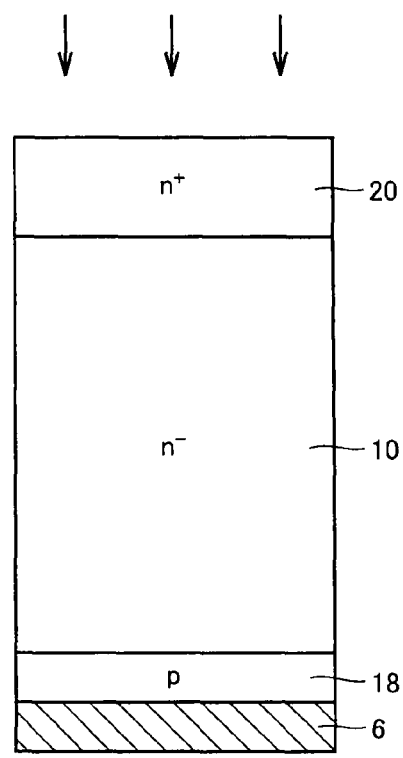
FIGS. 67 and 68 are respectively cross sections showing respective steps performed after respective steps in FIGS. 66 and 67 in the embodiment.
Figure 68:
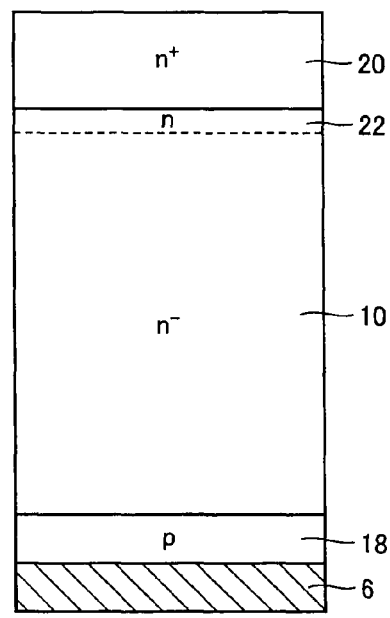

An example of the method of manufacturing the above-described PIN diode will be described. After steps similar to the above-described steps shown in FIGS. 44 to 46, as shown in FIG. 66, a polysilicon film 33 having a predetermined thickness is formed on the other main surface of n⁻-type silicon substrate 10. As shown in FIG. 67, n-type impurities are implanted by the ion implantation to polysilicon film 33 to form n⁺-type polysilicon film 20. As shown in FIG. 68, predetermined heat treatment is performed to thermally diffuse the n-type impurities in n⁺-type polysilicon film 20 to n⁻-type silicon substrate 10 and thereby form n-type region 22. After this, through a similar step to the above-described step shown in FIG. 50, PIN diode 2 shown in FIG. 63 is completed.

Regarding PIN diode 2 described above, since n⁺-type polysilicon film 20 having a grain boundary is formed in the region of a relatively high carrier density on the cathode side, carriers in this region can be caused to disappear at the grain boundary in a short time and the lifetime of PIN diode 2 can be shortened. Thus, the state of PIN diode 2 can be changed more speedily from the ON state to the OFF state. Further, by changing thickness t of n⁺-type polysilicon film 20, the ratio of carriers recombining to disappear to the whole implanted carriers can be changed precisely.

In other words, regarding PIN diode 2, according to characteristics of an inverter apparatus for example to which PIN diode 2 is applied, the thickness for example of n⁺-type polysilicon film 20 serving as a recombination center of carriers can be changed to precisely control the lifetime of PIN diode 2. The ON resistance can be reduced while ensuring the switching characteristic.

Eleventh Embodiment

A fifth example will be described of the PIN diode having its cathode side where a polysilicon film with a grain boundary is formed as a predetermined film having a crystal defect serving as a recombination center.

Figure 69:
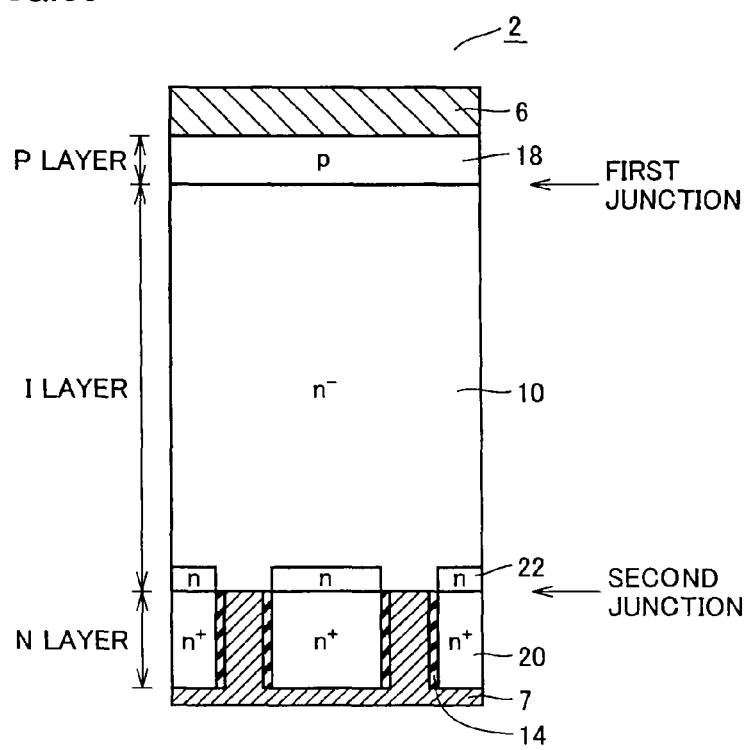
FIG. 69 is a cross section showing a configuration of a PIN diode according to an eleventh embodiment of the present invention.

As shown in FIG. 69, on one main surface of n⁻-type silicon substrate 10, p-type region 18 is formed to a predetermined depth from the surface. On the other main surface of n⁻-type silicon substrate 10, n⁺-type polysilicon film 20 is selectively formed. In a portion of n⁻-type silicon substrate 10 located immediately under n⁺-type polysilicon film 20, n-type region 22 is selectively formed to a predetermined depth from the surface of n⁻-type silicon substrate 10 such that n-type region 22 corresponds to n⁺-type polysilicon film 20. On the sidewall of n⁺-type polysilicon film 20, insulating film 14 is formed. Cathode electrode 7 is formed to be in contact with the surface of n⁻-type silicon substrate 10 exposed to the region where n⁺-type polysilicon film 20 is not formed and in contact with the surface of n⁺-type polysilicon film 20. Since components and features other than the above-described ones are similar to those of the PIN diode shown in FIG. 63, like components are denoted by like reference characters and the description thereof will not be repeated.

In PIN diode 2, n⁺-type polysilicon film 20 having a grain boundary serving as a recombination center is selectively formed on the cathode side to be in contact with the n⁺n junction. The graph (distribution) of the carrier density in the forward bias state of PIN diode 2 including the region where n⁺-type polysilicon film 20 is formed is substantially identical to the carrier density graph shown in FIG. 64.

Figure 70:
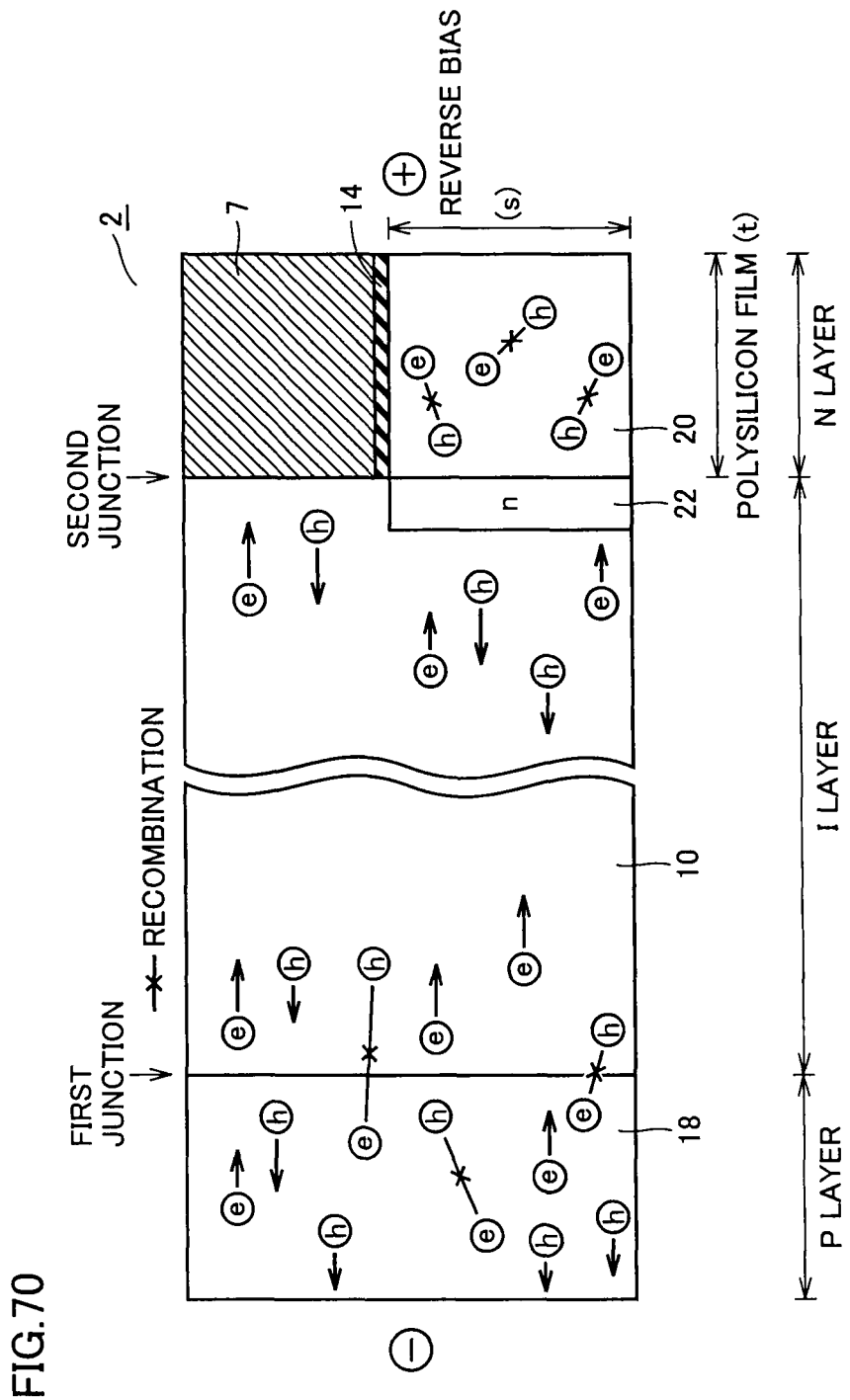
FIG. 70 illustrates behavior of carriers in a reverse bias state of the PIN diode in the embodiment.

Behavior of carriers in the reverse bias state of PIN diode 2 will be described. As shown in FIG. 70, as a reverse bias voltage is applied to PIN diode 2, carriers that are a part of implanted carriers and that are present in n⁺-type polysilicon film 20 disappear at a recombination center at the grain boundary in a short time. Regarding the remaining carriers including carriers present on the anode side, electrons are discharged from the cathode electrode and holes are discharged from the anode electrode. A part of electrons and holes recombine to disappear and the implanted carriers finally disappear. Thus, PIN diode 2 is turned off.

Figure 71:
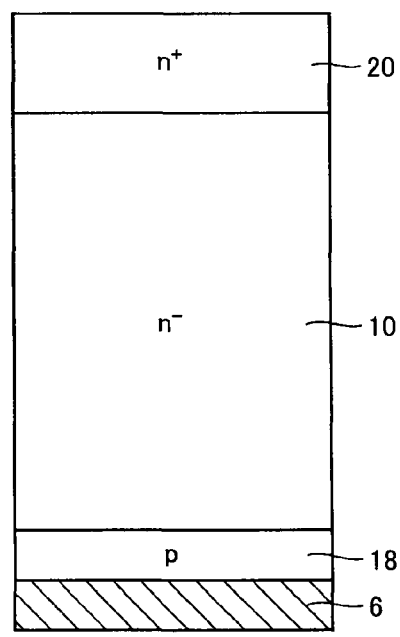
FIG. 71 is a cross section showing a step of a method of manufacturing the PIN diode in the embodiment.

An example of the method of manufacturing the above-described PIN diode will be described. After steps similar to the above-described steps shown in FIGS. 66 and 67, n⁺-type polysilicon film 20 is formed on the other surface of n⁻-type silicon substrate 10 as shown in FIG. 71.

Figure 72:
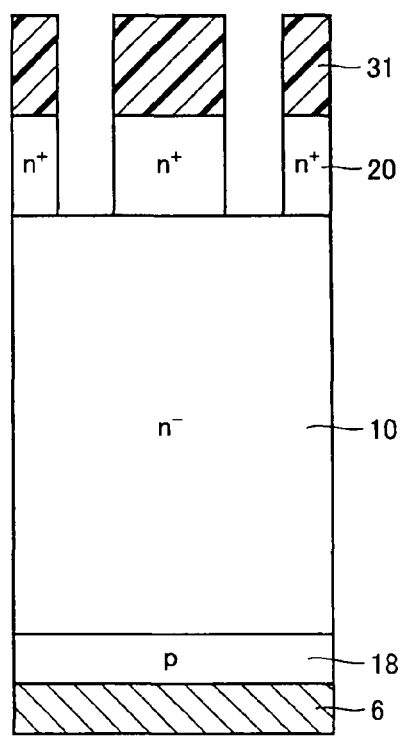
FIGS. 72 and 73 are respectively cross sections showing respective steps performed after respective steps shown in FIGS. 71 and 72 in the embodiment.

As shown in FIG. 72, on a surface of $n^+$-type polysilicon film 20, resist pattern 31 is formed. Resist pattern 31 is used as a mask to anisotropically etch $n^+$-type polysilicon film 20 and thereby leave $n^+$-type polysilicon film 20 in a predetermined region only while removing the portion of $n^+$-type polysilicon film 20 that is located in the other region to expose a surface of $n^-$-type silicon substrate 10. After this, resist pattern 31 is removed.

Figure 73:
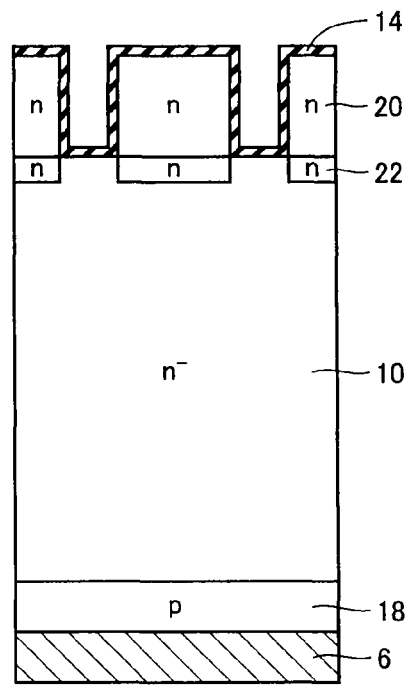

As shown in FIG. 73, predetermined heat treatment is performed to thermally diffuse n-type impurities in $n^+$-type polysilicon film 20 into $n^-$-type silicon substrate 10 and thereby selectively form n-type region 22. On the exposed surface of $n^-$-type silicon substrate 10 and on the surface of $n^+$-type polysilicon film 20, insulating film 14 is formed. After this, through a step similar to the above-described step shown in FIG. 56, PIN diode 2 shown in FIG. 69 is completed.

Regarding above-described PIN diode 2, since $n^+$-type polysilicon film 20 having a grain boundary is formed in a region of a relatively high carrier density on the cathode side, carriers present in the region can be caused to disappear at the grain boundary in a short time. Thus, the lifetime of PIN diode 2 can be shortened and the state of PIN diode 2 can be more speedily changed from the ON state to the OFF state.

Moreover, thickness t of $n^+$-type polysilicon film 20 may be changed and additionally $n^+$-type polysilicon film 20 may be selectively formed to change area S of the region where the polysilicon film is formed (see FIG. 70). The ratio of carriers recombining to disappear to the whole implanted carriers can thus be changed more precisely.

In other words, regarding PIN diode 2, according to characteristics of an inverter apparatus for example to which PIN diode 2 is applied, the area of the region where $n^+$-type polysilicon film 20 serving as a recombination center of carriers may be changed and the thickness of the polysilicon film for example may be changed to more precisely control the lifetime of PIN diode 2 and reduce the ON resistance while ensuring the switching characteristic.

Twelfth Embodiment

A description will be given of a sixth example of the PIN diode having its cathode side where a polysilicon film with a grain boundary is formed as a predetermined film having a crystal defect serving as a recombination center.

Figure 74:
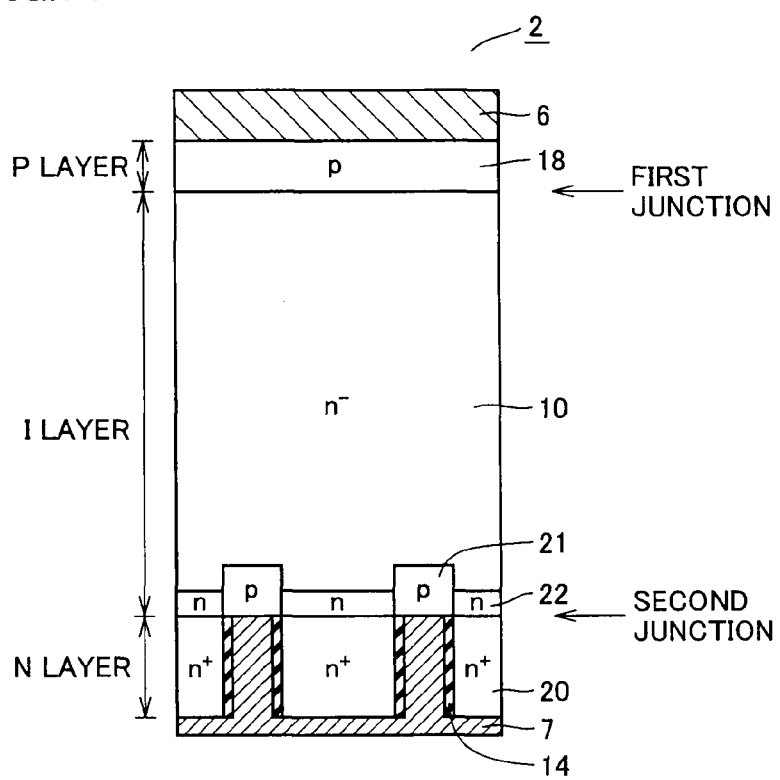
FIG. 74 is a cross section showing a configuration of a PIN diode according to a twelfth embodiment of the present invention.

As shown in FIG. 74, on one main surface of $n^-$-type silicon substrate 10, p-type region 18 is formed to a predetermined depth from the surface. On the other main surface of $n^-$-type silicon substrate 10, $n^+$-type polysilicon film 20 is selectively formed. In a portion of $n^-$-type silicon substrate 10 that is located directly below $n^+$-type polysilicon film 20, n-type region 22 is selectively formed to a predetermined depth from the surface to correspond to $n^+$-type polysilicon film 20. In a portion of $n^-$-type silicon substrate 10 that is located in the region where $n^+$-type polysilicon film 20 is not formed, p-type region 21 (tenth region) is formed. Other components and features are similar to those of the PIN diode shown in FIG. 69. Therefore, like components are denoted by like reference characters and the detailed description thereof will not be repeated.

This PIN diode is configured similarly to the PIN diode shown in FIG. 69 except that p-type region 21 is formed. Further, the graph (distribution) of the carrier density in the forward bias state of PIN diode 2 including the region where $n^+$-type polysilicon film 20 is formed is substantially identical to the graph of the carrier density shown in FIG. 64.

Figure 75:
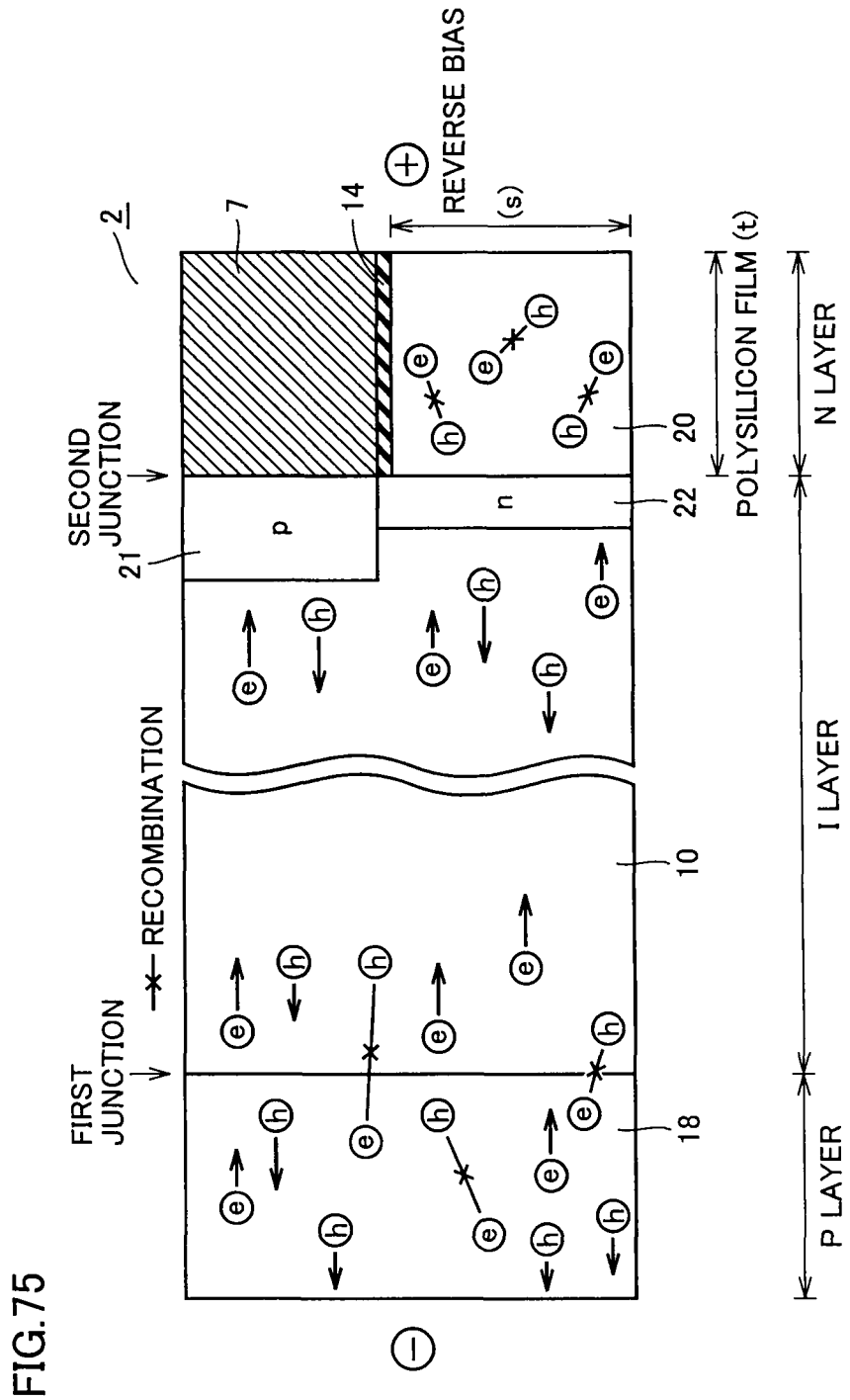
FIG. 75 illustrates behavior of carriers in a reverse bias state of the PIN diode in the embodiment.

Behavior of carriers in the reverse bias state of PIN diode 2 is also substantially identical to that in the PIN diode shown in FIG. 69. As shown in FIG. 75, as a reverse bias voltage is applied to PIN diode 2, carriers that are a part of implanted carriers and that are present in $n^+$-type polysilicon film 20 disappear at a recombination center at the grain boundary in a short time. Regarding the remaining carriers including carriers present on the anode side, electrons are discharged from the cathode electrode and holes are discharged from the anode electrode. A part of electrons and holes recombine to disappear and the implanted carriers finally disappear. PIN diode 2 is thus turned off.

Figure 76:
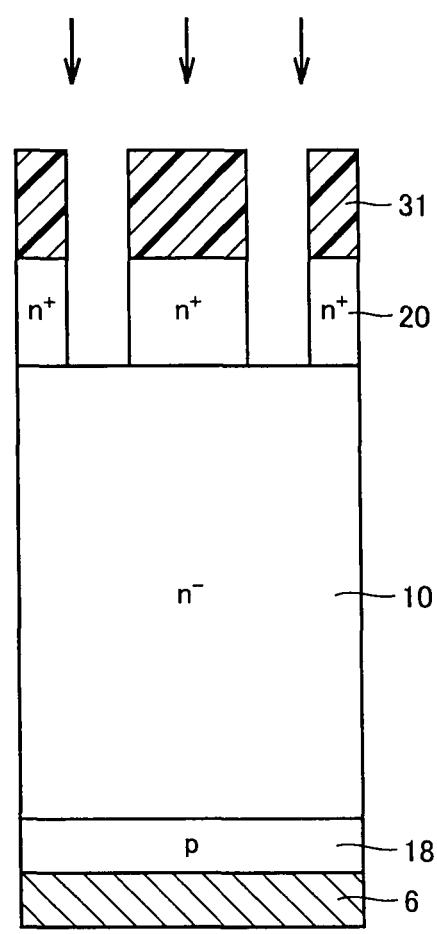
FIG. 76 is a cross section showing a step of a method of manufacturing the PIN diode in the embodiment.

An example of the method of manufacturing the above-described PIN diode will be described. After steps similar to the above-described steps shown in FIGS. 71 and 72, resist pattern 31 is used as a mask to implant p-type impurities by the ion implantation to the exposed surface of $n^-$-type silicon substrate 10 as shown in FIG. 76. After this, resist pattern 31 is removed.

Figure 77:
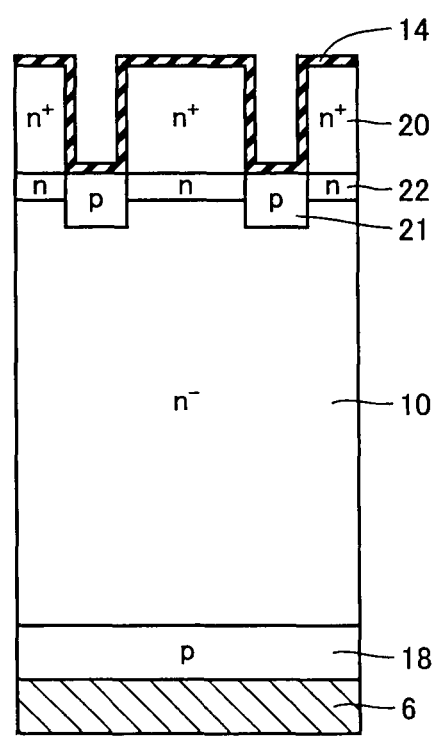
FIG. 77 is a cross section showing a step performed after the step shown in FIG. 76 in the embodiment.

As shown in FIG. 77, predetermined heat treatment is performed to thermally diffuse the n-type impurities in $n^+$-type polysilicon film 20 to $n^-$-type silicon substrate 10 and thereby selectively form n-type region 22. Further, p-type impurities that are implanted to the exposed $n^-$-type silicon substrate 10 are thermally diffused to form p-type region 21. In addition, insulating film 14 is formed on the exposed surface of $n^-$-type silicon substrate 10 and on a surface of p-type polysilicon film 20. After this, through a step similar to the above-described step shown in FIG. 56, PIN diode 2 shown in FIG. 74 is completed.

Regarding PIN diode 2 as described above, since p-type region 21 is formed, the ratio of electrons recombining with holes to disappear in the reverse bias state increases. Further, since holes remain at the pn junction interface between p-type region 21 and $n^-$-type silicon substrate 10, the rate of decrease of the reverse recovery current can be reduced (soft recovery). Thus, the thickness of the polysilicon film and the region where the polysilicon film is formed may be changed and additionally p-type region 21 may be formed so as to more precisely change the ratio of carriers recombining to disappear to the whole implanted carriers, and the soft recovery can be accomplished.

In other words, regarding PIN diode 2, according to characteristics of an inverter apparatus for example to which PIN diode 2 is applied, the area of the region where $n^+$-type polysilicon film 20 serving as a recombination center of carriers as well as the thickness of the film for example can be changed and further p-type region 21 can be formed to more precisely control the lifetime of PIN diode 2. Thus, while the switching characteristic is ensured, the ON resistance can be reduced. Further, when a reverse bias voltage is applied, the soft recovery can be accomplished.

In the above-described embodiments each, the description is given of the case as an example where a polysilicon film is formed as a film having a crystal defect which serves as a recombination center of carriers. The film having a crystal defect is not limited to the polysilicon film. For example, the film may be an amorphous silicon film. When the amorphous silicon film is used as a film having a crystal defect, in the process of implanting p- or n-type impurities to the silicon substrate, laser annealing may be applied to a region which is made amorphous so as to change the grain size or selectively recrystallize only the surface of the region. Here, the amorphous silicon film may be formed by chemical vapor deposition at a temperature of approximately six hundreds and several tens degrees centigrade.

Further, depending on the state of the interface between the silicon substrate and the polysilicon film (interface between $n^-$-type silicon substrate 10 and n-type polysilicon film 1, interface between p-type region 17 (silicon substrate) and p-type polysilicon film 16, interface between $n^-$-type silicon substrate 10 and n-type region 19, interface between n-type region 22 (silicon substrate) and n⁺-type region 20), behavior of carriers varies so that the lifetime of the PIN diode can be controlled. For example, if a natural oxide film is formed at the interface, movement of carriers is hindered. In contrast, if many defects are present, movement of carriers is facilitated. Thus, a desired state of the interface may be provided to control the lifetime.

Furthermore, in the above-described embodiments each, the case is described as an example where the film having a crystal defect is formed on one of the anode side and the cathode side. Alternatively, a film having its anode side and its cathode side where crystal defects are present on both sides may be formed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   an anode portion including a first region of a first conductivity type;
   a cathode portion including a second region of a second conductivity type;
   an intermediate portion located between said anode portion and said cathode portion and joined to said anode portion and to said cathode portion;
   a predetermined film having a crystal defect and formed in at least one of a portion on a side of said anode and a portion on a side of said cathode, carriers of a higher density than a density of carriers present around a center in a thickness direction of said intermediate portion in a forward bias state being present in said portions on respective sides of said anode and said cathode,
   said intermediate portion including
      a predetermined substrate, and
      a third region of the second conductivity type formed on a surface of said substrate to be in contact with the surface of said substrate and joined to said first region;
   a maximum impurity density of said third region being higher than an impurity density of said predetermined substrate and lower than a maximum impurity density of said anode portion;
   said first region and said third region being formed of said predetermined film; and
   said predetermined film being one selected from a group consisting of a polysilicon film and an amorphous silicon film.

2. The semiconductor device according to claim 1, wherein said first region and said third region are selectively formed on the surface of said substrate.

3. The semiconductor device according to claim 2, wherein a fourth region of the second conductivity type is formed to a predetermined depth from the surface of said substrate, in a portion of said substrate where said first region and said third region are not formed.

4. The semiconductor device according to claim 1, wherein said first region and said third region are formed on the surface of said substrate to selectively include a first portion of a predetermined thickness and a second portion of a thickness smaller than said predetermined thickness.

5. The semiconductor device according to claim 1, wherein said intermediate portion includes:
   a predetermined substrate; and
   a fifth region of the first conductivity type formed to a predetermined depth from a surface of said substrate and joined to said first region, and
   said first region is formed of said predetermined film.

6. The semiconductor device according to claim 5, wherein said first region is selectively formed on the surface of said substrate, and
   said fifth region is selectively formed in a portion of said substrate located directly below said first region so as to correspond to said first region.

7. The semiconductor device according to claim 6, wherein a sixth region of the second conductivity type is formed to a predetermined depth from the surface of said substrate, in a portion of said substrate where said first region and said fifth region are not formed.

8. The semiconductor device according to claim 1, wherein said intermediate portion includes:
   a predetermined substrate; and
   a seventh region of the second conductivity type formed on a surface of said substrate to be in contact with the surface of said substrate and joined to said second region, and
   said second region and said seventh region are formed of said predetermined film.

9. The semiconductor device according to claim 8, wherein said second region and said seventh region are selectively formed on the surface of said substrate.

10. The semiconductor device according to claim 9, wherein
    an eighth region of the first conductivity type is formed to a predetermined depth from the surface of said substrate, in a portion of said substrate where said second region and said seventh region are not formed.

11. The semiconductor device according to claim 8, wherein
    said second region and said seventh region are formed on the surface of said substrate to selectively include a first portion of a predetermined thickness and a second portion of a thickness smaller than said predetermined thickness.

12. The semiconductor device according to claim 11, wherein
    in said second portion, an eighth region of the first conductivity type is formed to a predetermined depth from a surface of said second portion.

13. The semiconductor device according to claim 1, wherein
    said intermediate portion includes:
    a predetermined substrate; and
    a ninth region of the second conductivity type formed to a predetermined depth from a surface of said substrate and joined to said second region, and
    said second region is formed of said predetermined film.

14. The semiconductor device according to claim 13, wherein
    said second region is selectively formed on the surface of said substrate, and
    said ninth region is selectively formed in a portion of said substrate located directly below said second region so as to correspond to said second region.

15. The semiconductor device according to claim 14, wherein
    a tenth region of the first conductivity type is formed to a predetermined depth from the surface of said substrate, in a portion of said substrate where said second region and said ninth region are not formed.

16. The semiconductor device according to claim 1, wherein a graph of the density of the carriers in the forward bias state is a curve of a substantially hyperbolic function connecting an end of the anode portion closest to the intermediate portion and an end of the cathode portion closest to the intermediate portion.

17. The semiconductor device according to claim 1, wherein a density of carriers at the anode portion in the forward bias state is identical to an impurity density of the first region.

18. The semiconductor device according to claim 1, wherein a density of carriers at the cathode portion in the forward bias state is identical to an impurity density of the second region.

19. The semiconductor device according to claim 1, wherein a density of carriers at each location in the intermediate portion in the forward bias state is greater than the maximum impurity density of the intermediate portion.

* * * * *